United States Patent
Dozen et al.

(10) Patent No.: US 8,432,018 B2
(45) Date of Patent: Apr. 30, 2013

(54) SEMICONDUCTOR DEVICE AND MANUFACTURING METHOD OF SEMICONDUCTOR DEVICE

(75) Inventors: Yoshitaka Dozen, Tochigi (JP); Tomoyuki Aoki, Tochigi (JP); Hidekazu Takahashi, Tochigi (JP); Daiki Yamada, Tochigi (JP); Eiji Sugiyama, Tochigi (JP); Kaori Ogita, Tochigi (JP); Naoto Kusumoto, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/271,469

(22) Filed: Oct. 12, 2011

(65) Prior Publication Data

US 2012/0080810 A1 Apr. 5, 2012

Related U.S. Application Data

(63) Continuation of application No. 12/854,060, filed on Aug. 10, 2010, now Pat. No. 8,039,353, and a continuation of application No. 11/812,813, filed on Jun. 21, 2007, now Pat. No. 7,851,886.

(30) Foreign Application Priority Data

Jun. 26, 2006 (JP) ................................ 2006-175611

(51) Int. Cl.
*H01L 29/06* (2006.01)
(52) U.S. Cl.
USPC ................... 257/531; 257/532; 257/E29.009; 257/679; 257/528

(58) Field of Classification Search ............... 257/528, 257/531, 532, 679, E29.009
See application file for complete search history.

(56) References Cited

U.S. PATENT DOCUMENTS

| | | | |
|---|---|---|---|
| 5,599,046 | A | 2/1997 | Behm et al. |
| 6,849,877 | B2 | 2/2005 | Yamazaki et al. |
| 6,918,535 | B1 | 7/2005 | Brosow |
| 7,032,828 | B2 | 4/2006 | Krul et al. |

(Continued)

FOREIGN PATENT DOCUMENTS

| | | |
|---|---|---|
| DE | 102004018081 | 10/2005 |
| EP | 1453088 A | 9/2004 |

(Continued)

*Primary Examiner* — Victor A Mandala
(74) *Attorney, Agent, or Firm* — Eric J. Robinson; Robinson Intellectual Property Law Office, P.C.

(57) ABSTRACT

The present invention provides a thin and bendable semiconductor device utilizing an advantage of a flexible substrate used in the semiconductor device, and a method of manufacturing the semiconductor device. The semiconductor device has at least one surface covered by an insulating layer which serves as a substrate for protection. In the semiconductor device, the insulating layer is formed over a conductive layer serving as an antenna such that the value in the thickness ratio of the insulating layer in a portion not covering the conductive layer to the conductive layer is at least 1.2, and the value in the thickness ratio of the insulating layer formed over the conductive layer to the conductive layer is at least 0.2. Further, not the conductive layer but the insulating layer is exposed in the side face of the semiconductor device, and the insulating layer covers a TFT and the conductive layer.

16 Claims, 16 Drawing Sheets

U.S. PATENT DOCUMENTS

| | | | | |
|---|---|---|---|---|
| 7,211,828 | B2 | 5/2007 | Yamazaki et al. | |
| 7,297,613 | B1 * | 11/2007 | Mountain | 438/458 |
| 7,351,644 | B2 * | 4/2008 | Henley | 438/458 |
| 7,354,801 | B2 | 4/2008 | Sugiyama et al. | |
| 7,420,208 | B2 | 9/2008 | Yamazaki et al. | |
| 7,449,372 | B2 | 11/2008 | Fujii et al. | |
| 7,452,786 | B2 | 11/2008 | Dozen et al. | |
| 7,466,233 | B2 | 12/2008 | Drapala et al. | |
| 7,476,575 | B2 | 1/2009 | Tsurume et al. | |
| 7,482,248 | B2 | 1/2009 | Tamura | |
| 7,508,305 | B2 | 3/2009 | Yamazaki et al. | |
| 7,561,052 | B2 | 7/2009 | Arai et al. | |
| 7,566,971 | B2 | 7/2009 | Matsuzaki | |
| 7,591,863 | B2 | 9/2009 | Watanabe et al. | |
| 7,630,233 | B2 | 12/2009 | Kato et al. | |
| 7,728,326 | B2 | 6/2010 | Yamazaki et al. | |
| 7,816,721 | B2 | 10/2010 | Yamazaki et al. | |
| 7,851,886 | B2 | 12/2010 | Dozen et al. | |
| 7,879,654 | B2 | 2/2011 | Dozen et al. | |
| 7,935,958 | B2 | 5/2011 | Abe et al. | |
| 7,952,101 | B2 | 5/2011 | Yamazaki et al. | |
| 7,960,719 | B2 | 6/2011 | Kato | |
| 7,973,313 | B2 | 7/2011 | Arai et al. | |
| 7,975,926 | B2 | 7/2011 | Yamazaki et al. | |
| 8,045,369 | B2 | 10/2011 | Kato et al. | |
| 8,134,149 | B2 | 3/2012 | Yamazaki et al. | |
| 2003/0224582 | A1 * | 12/2003 | Shimoda et al. | 438/458 |
| 2005/0140495 | A1 | 6/2005 | Yamazaki et al. | |
| 2005/0287846 | A1 | 12/2005 | Dozen et al. | |
| 2006/0011288 | A1 | 1/2006 | Watanabe et al. | |
| 2006/0063351 | A1 * | 3/2006 | Jain | 438/455 |
| 2006/0127141 | A1 | 6/2006 | Seorl et al. | |
| 2006/0134918 | A1 | 6/2006 | Fujii et al. | |
| 2006/0176181 | A1 | 8/2006 | Halope | |
| 2006/0250242 | A1 | 11/2006 | Drapala et al. | |
| 2007/0032084 | A1 * | 2/2007 | Henley | 438/692 |
| 2007/0083381 | A1 | 4/2007 | Farrell et al. | |
| 2008/0038902 | A1 * | 2/2008 | Lee | 438/458 |
| 2009/0283886 | A1 * | 11/2009 | Yamazaki | 257/679 |
| 2010/0163859 | A1 | 7/2010 | Yamazaki et al. | |
| 2010/0283062 | A1 * | 11/2010 | Hsieh et al. | 257/79 |
| 2011/0031469 | A1 | 2/2011 | Yamazaki et al. | |
| 2011/0223966 | A1 | 9/2011 | Arai et al. | |

FOREIGN PATENT DOCUMENTS

| | | |
|---|---|---|
| EP | 2381476 A | 10/2011 |
| JP | 2001-230269 A | 8/2001 |
| JP | 2002-298118 A | 10/2002 |
| JP | 2002-319006 A | 10/2002 |
| JP | 2003-100450 A | 4/2003 |
| JP | 2005-259984 A | 9/2005 |
| JP | 2005-317955 A | 11/2005 |
| JP | 2006-019717 A | 1/2006 |
| JP | 2006-041502 A | 2/2006 |
| JP | 2006-049851 A | 2/2006 |
| JP | 2006-060196 A | 3/2006 |
| JP | 2006-093209 A | 4/2006 |
| JP | 2006-135305 A | 5/2006 |
| JP | 2006-148088 A | 6/2006 |
| JP | 2006-157038 A | 6/2006 |
| JP | 2006-165535 A | 6/2006 |
| WO | WO-2005/096380 | 10/2005 |
| WO | WO-2005/119781 | 12/2005 |
| WO | WO-2005/121908 | 12/2005 |
| WO | WO-2006/001287 | 1/2006 |
| WO | WO-2006/043687 | 4/2006 |

* cited by examiner

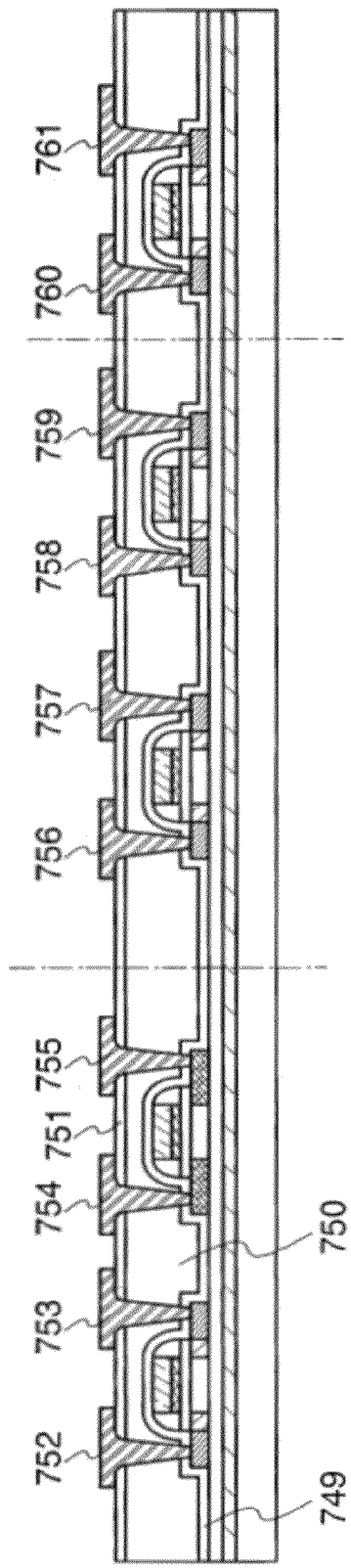
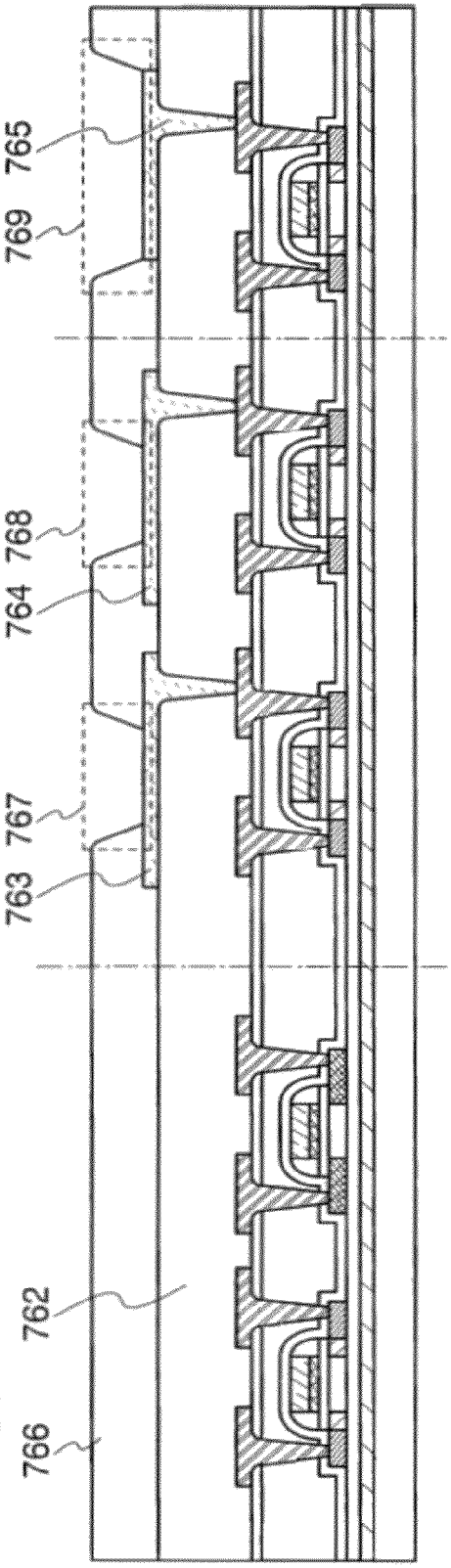
FIG. 3A
FIG. 3B

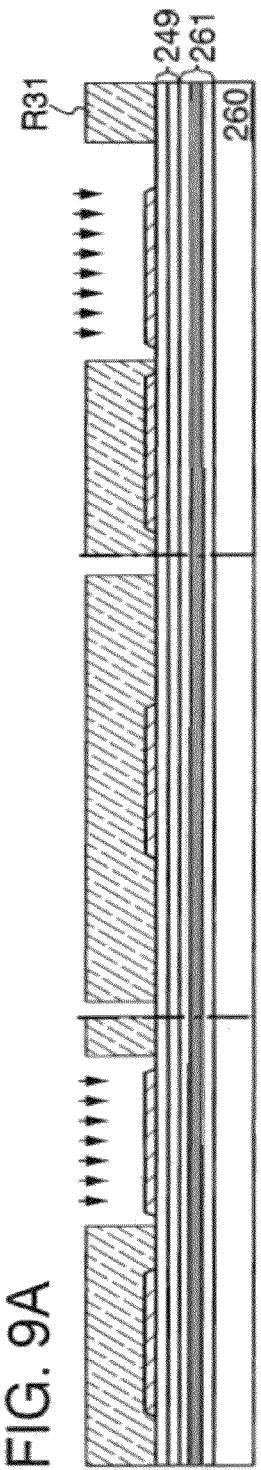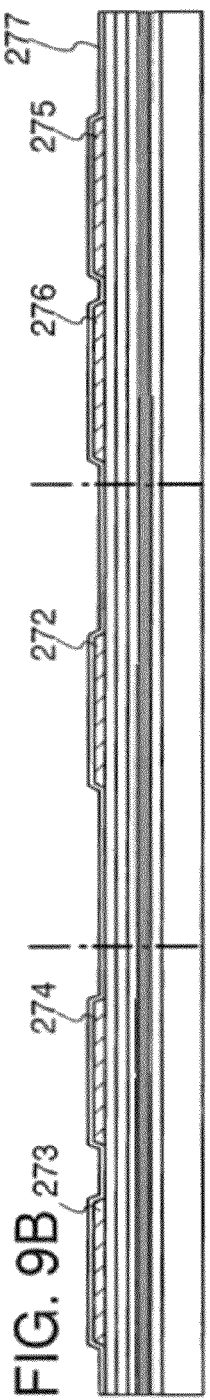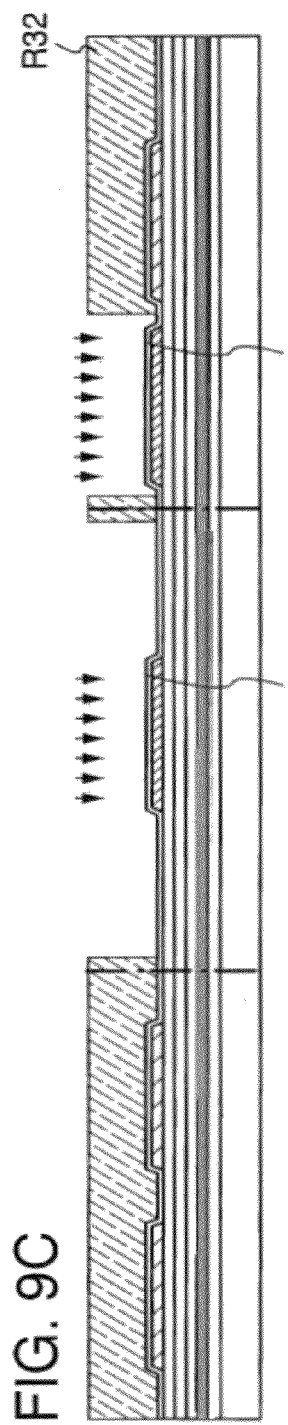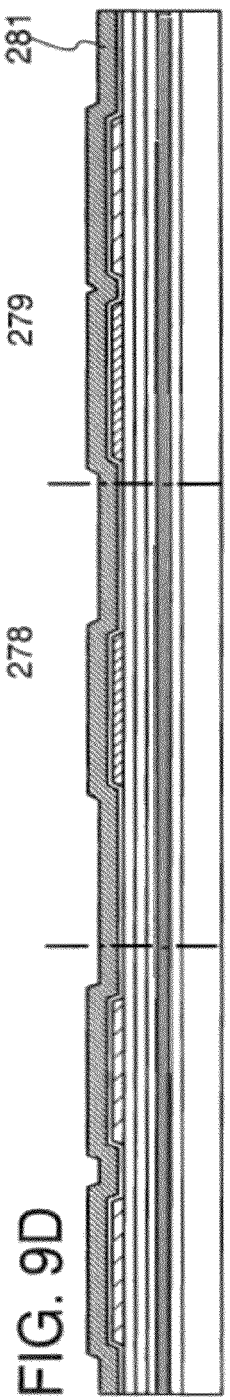

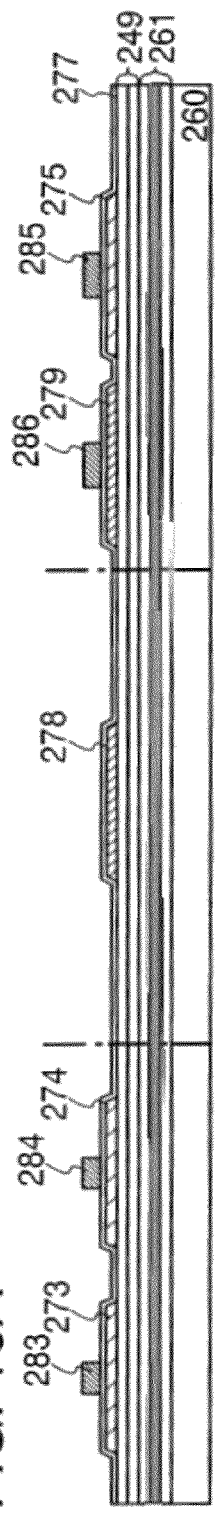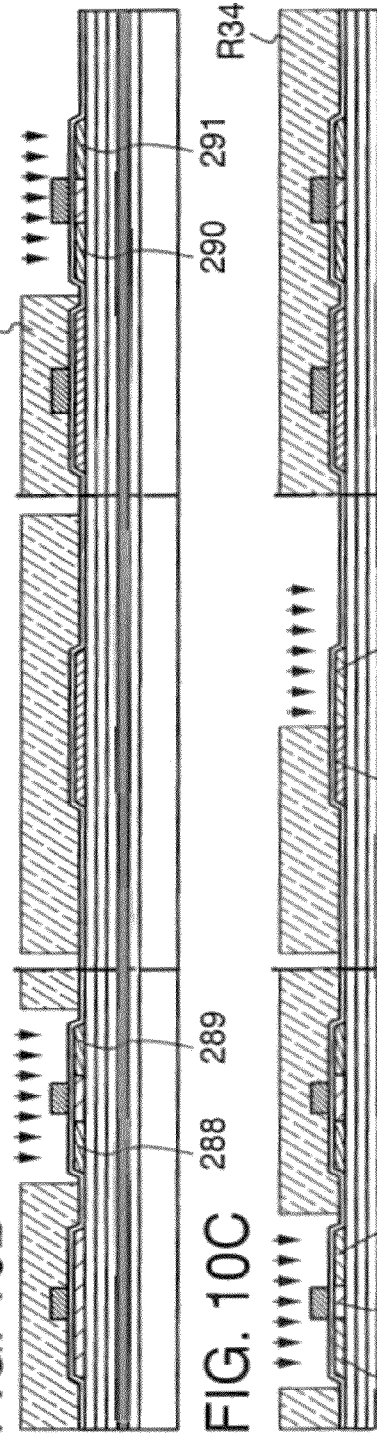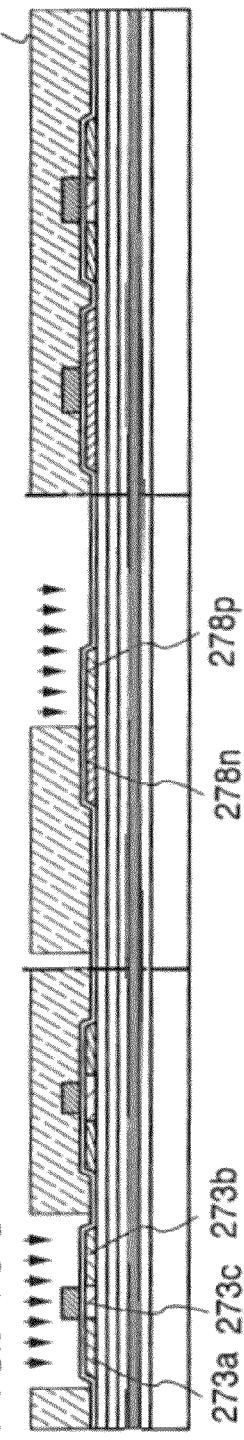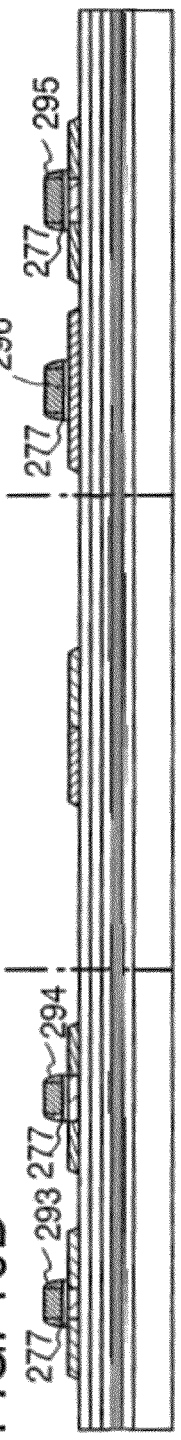

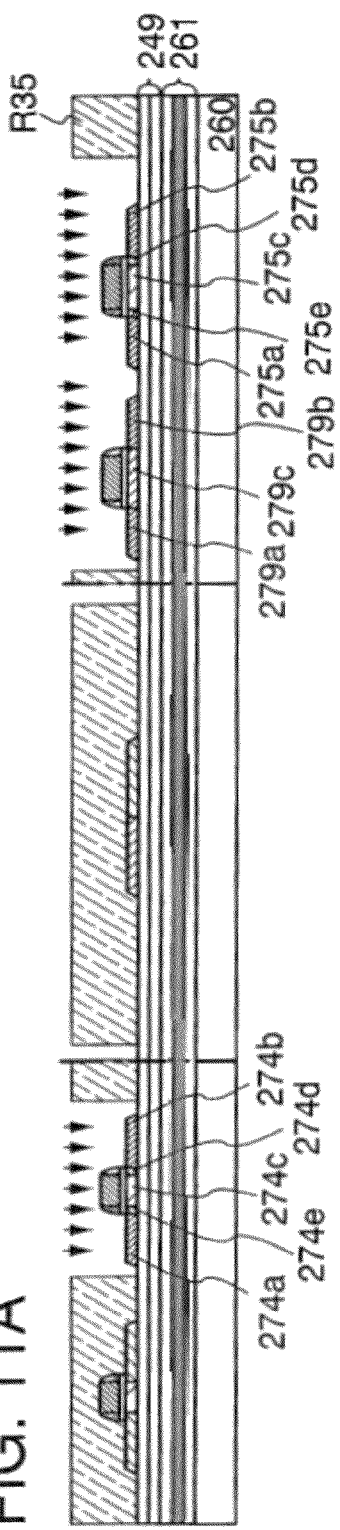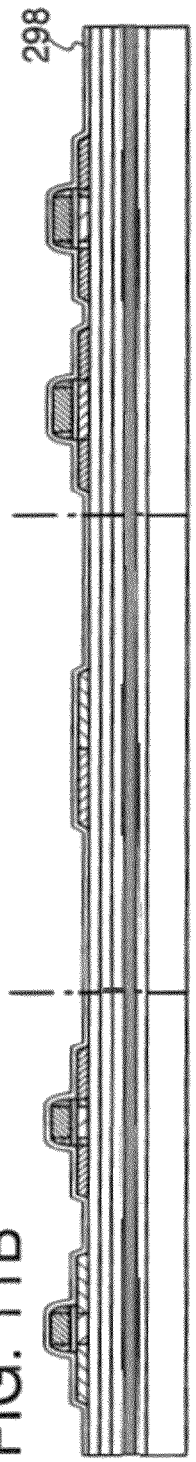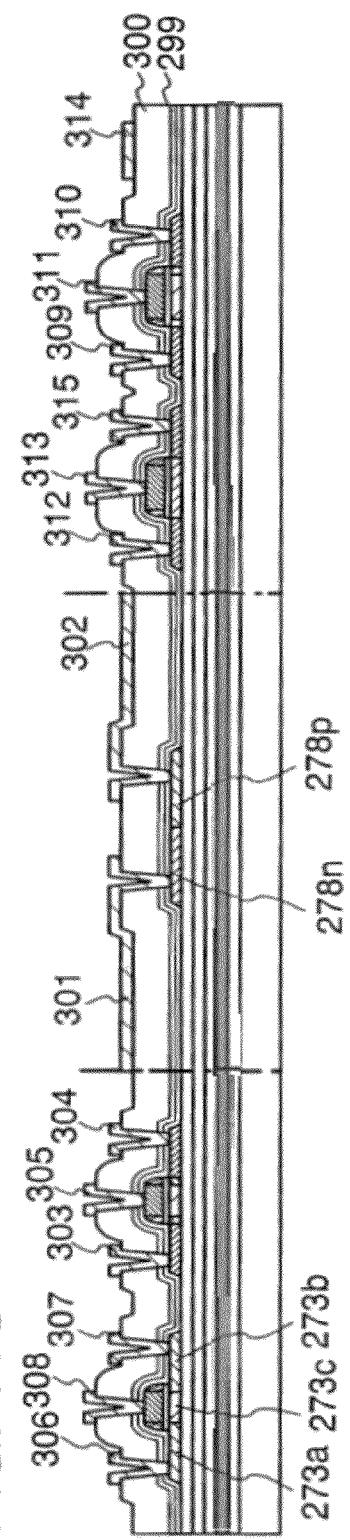

SEMICONDUCTOR DEVICE AND MANUFACTURING METHOD OF SEMICONDUCTOR DEVICE

BACKGROUND OF THE INVENTION

1. Field of the Invention

The present invention relates to semiconductor devices including circuit elements and a manufacturing method of the semiconductor devices. Further, the present invention relates to semiconductor devices which can conduct data communication with wireless communication.

2. Description of the Related Art

Currently, it is important to make thin-mode various devices such as wireless chips and sensors in miniaturizing products, and the technologies and the application range spread rapidly. Such various thin-mode devices are flexible to some extent and thus the devices can be set in an object having a curved surface. IC chips in which an integrated circuit is formed on a flexible substrate, and the like have been proposed (for example, Japanese Published Patent Application No. 2006-19717).

SUMMARY OF THE INVENTION

However, in a conventional technique, it is necessary to cover a surface of a device by a somewhat hard substrate in order to protect the device. The substrate is flexible but is hard because it has a somewhat large thickness, and thus, a device itself using the substrate becomes thick, which leads to prevention of the flexibility of the device. Therefore, for example, an object provided with the device gives a user a feeling of strangeness. So far, devices which make full use of a flexible substrate have not been provided. In view of the above, the present invention provides semiconductor devices which are thinner and more bendable, and a method of manufacturing such semiconductor devices.

A semiconductor device of the present invention has at least one surface covered by an insulating layer (protective film) which serves as a substrate for protection. In the semiconductor device, the insulating layer (also referred to as an insulating film) is formed over a conductive layer serving as an antenna such that the value in the thickness ratio of the insulating layer in a portion not covering the conductive layer (also referred to as a conductive film) to the conductive layer is at least 1.2, and the value in the thickness ratio of the insulating layer formed over the conductive layer to the conductive layer is at least 0.2. In other words, the insulating layer is formed over the conductive layer such that the thickness ratio of the conductive layer serving as an antenna to the insulating layer not covering the conductive layer is 1:1.2, and the thickness ratio of the conductive layer to the insulating layer formed over the conductive layer is at least 1:0.2. Further, not the conductive layer but the insulating layer is exposed in the side face of the semiconductor device, and the insulating layer covers a TFT and the conductive layer. In addition, in the semiconductor device of the present invention, as a substrate covering an element formation layer side, a substrate having a support on its surface is used in the manufacturing process.

An aspect of the present invention is a semiconductor device which includes an element formation layer formed over a substrate; a storage element portion formed over the element formation layer; a conductive layer serving as an antenna formed over the element formation layer; and a resin layer formed over the element formation layer, the storage element portion and the conductive layer serving as an antenna. In the semiconductor device, a value in a thickness ratio of the resin layer in a portion not covering the conductive layer to the conductive layer is at least 1.2, and a value in a thickness ratio of the resin layer formed over the conductive layer to the conductive layer is at least 0.2.

Another aspect of the present invention is a semiconductor device which includes an element formation layer formed over a substrate; a storage element portion formed over the element formation layer; a conductive layer serving as an antenna formed over the element formation layer; and a protective film formed over the element formation layer, the storage element portion and the conductive layer serving as an antenna. In the semiconductor device, a value in a thickness ratio of the protective film in a portion not covering the conductive layer to the conductive layer is at least 1.2, and a value in a thickness ratio of the protective film formed over the conductive layer to the conductive layer is at least 0.2.

Another aspect of the present invention is a semiconductor device which includes an element formation layer formed over a substrate; a storage element portion formed over the element formation layer; a conductive layer serving as an antenna formed over the element formation layer; and a resin layer formed over the element formation layer, the storage element portion and the conductive layer serving as an antenna. In the semiconductor device, the element formation layer comprises a circuit for writing in data into the storage element portion and reading out data from the storage element portion, and a first semiconductor layer (also referred to as a semiconductor film) including an n-type impurity region and a p-type impurity region which are jointed, the circuit includes a plurality of thin film transistors, the first semiconductor layer is formed over the same surface as a second semiconductor layer of the thin film transistor, and a value in a thickness ratio of the resin layer in a portion not covering the conductive layer to the conductive layer is at least 1.2, and a value in a thickness ratio of the resin layer formed over the conductive layer to the conductive layer is at least 0.2.

Another aspect of the present invention is a semiconductor device which includes an element formation layer formed over a substrate; a storage element portion formed over the element formation layer; a conductive layer serving as an antenna formed over the element formation layer; and a protective film formed over the element formation layer, the storage element portion and the conductive layer serving as an antenna. In the semiconductor device, the element formation layer comprises a circuit for writing in data into the storage element portion and reading out data from the storage element portion, and a first semiconductor layer including an n-type impurity region and a p-type impurity region which are jointed, the circuit includes a plurality of thin film transistors, the first semiconductor layer is formed over the same surface as a second semiconductor layer of the thin film transistor, and a value in a thickness ratio of the protective film in a portion not covering the conductive layer to the conductive layer is at least 1.2, and a value in a thickness ratio of the protective film formed over the conductive layer to the conductive layer is at least 0.2.

In the semiconductor device of the present invention, the resin layer is formed of epoxy resin.

In the semiconductor device of the present invention, the protective layer is formed of epoxy resin.

In the semiconductor device of the present invention, the substrate has a thickness of 2 μm to 20 μm, inclusive.

In the semiconductor device of the present invention, the element formation layer is formed over the substrate with an adhesive layer therebetween.

Another aspect of the present invention is a method of manufacturing a semiconductor device includes the steps of forming a peeling layer over a first substrate; forming an element formation layer over the peeling layer; forming a storage element portion and a conductive layer serving as and an antenna over the element formation layer; forming a protective film over the element formation layer, the storage element portion and the conductive layer serving as an antenna; forming a second substrate over the protective film, and separating the first substrate from the element formation layer, using the second substrate; forming the element formation layer to be in contact with a third substrate having a support with an adhesive layer therebetween; and removing the second substrate and the support.

In the semiconductor device of the present invention, wherein the second substrate has a thickness of 2 μm to 20 μm, inclusive.

In the semiconductor device of the present invention, the resin layer is formed of epoxy resin.

A semiconductor device of the present invention has at least one surface covered by a resin. Thus, in the semiconductor device, a storage element portion and an element formation layer below the resin layer can be protected from dusts and the like, and the mechanical strength of the semiconductor device can be kept. Further, in the semiconductor device of the present invention, a resin layer is used as a substrate covering at least one surface, and thus a semiconductor device which is thin and bendable can be provided.

In the semiconductor device of the present invention, the insulating layer is formed over the conductive layer serving as an antenna such that the thickness ratio of the insulating layer in a portion not covering the conductive layer to the conductive layer serving as an antenna is at least 1.2, and the thickness ratio of the insulating layer formed over the conductive layer to the conductive layer is at least 0.2. Thus, the surface of the insulting layer has a sufficient planarity to reduce damages to the element formation layer in a manufacturing process of the semiconductor device. In addition, a semiconductor device having a mechanical strength enough to protect a storage element portion and an element formation layer can be obtained.

In the semiconductor device of the present invention, a conductive layer is not exposed in the side face of the semiconductor device, and an insulating layer covering a TFT and the conductive layer is exposed. Thus, elements such as a TFT or an antenna can be protected from dusts and the like by only the insulating layer covering the conductive layer serving as an antenna, and thus the semiconductor device which does not easily deteriorate can be provided.

In addition, in the semiconductor device of the present invention, as a substrate covering an element formation layer side, a substrate having a support on its surface is used in the manufacturing process, and thus, the substrate having a thickness of 2 μm to 20 μm can be easily handled. Therefore, a semiconductor device which is thin and bendable can be easily manufactured.

BRIEF DESCRIPTION OF THE DRAWINGS

In the accompanying drawings:
FIGS. 3A and 3B illustrate a process of manufacturing a semiconductor device according to an aspect of the present invention;
FIGS. 9A to 9D illustrates a process of manufacturing a semiconductor device according to an aspect of the present invention;
FIGS. 10A to 10D illustrates a process of manufacturing a semiconductor device according to an aspect of the present invention;
FIGS. 11A to 11C illustrates a process of manufacturing a semiconductor device according to an aspect of the present invention.

DETAILED DESCRIPTION OF THE INVENTION

Figure 1A:
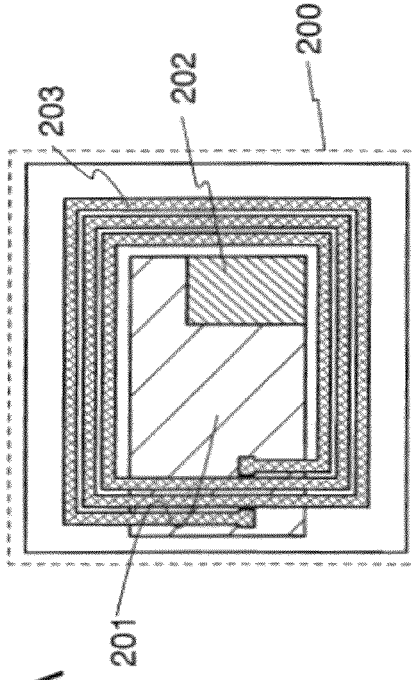
FIGS. 1A and 1B illustrate a process of manufacturing a semiconductor device according to an aspect of the present invention.

Embodiment Modes of the present invention are described with reference to drawings in detail. Note that the present invention can be carried out in many different modes. It is easily understood by those skilled in the art that modes and details disclosed herein can be modified in various ways without departing from the spirit and the scope of the present invention. Therefore, it should be noted that the present invention should not be interpreted as being limited to the description of the embodiment modes given below. Further, Embodiment Modes 1 to 4 can be freely combined with each other. In other words, materials and formation methods to be described in Embodiment Modes 1 to 4 can be freely combined. Note that in the structures of the present invention, similar portions are denoted by the same reference numerals through the drawings.

Embodiment Mode 1

Embodiment Mode 1 will explain an example of a semiconductor device of the present invention with reference to drawings.

Figure 1B:
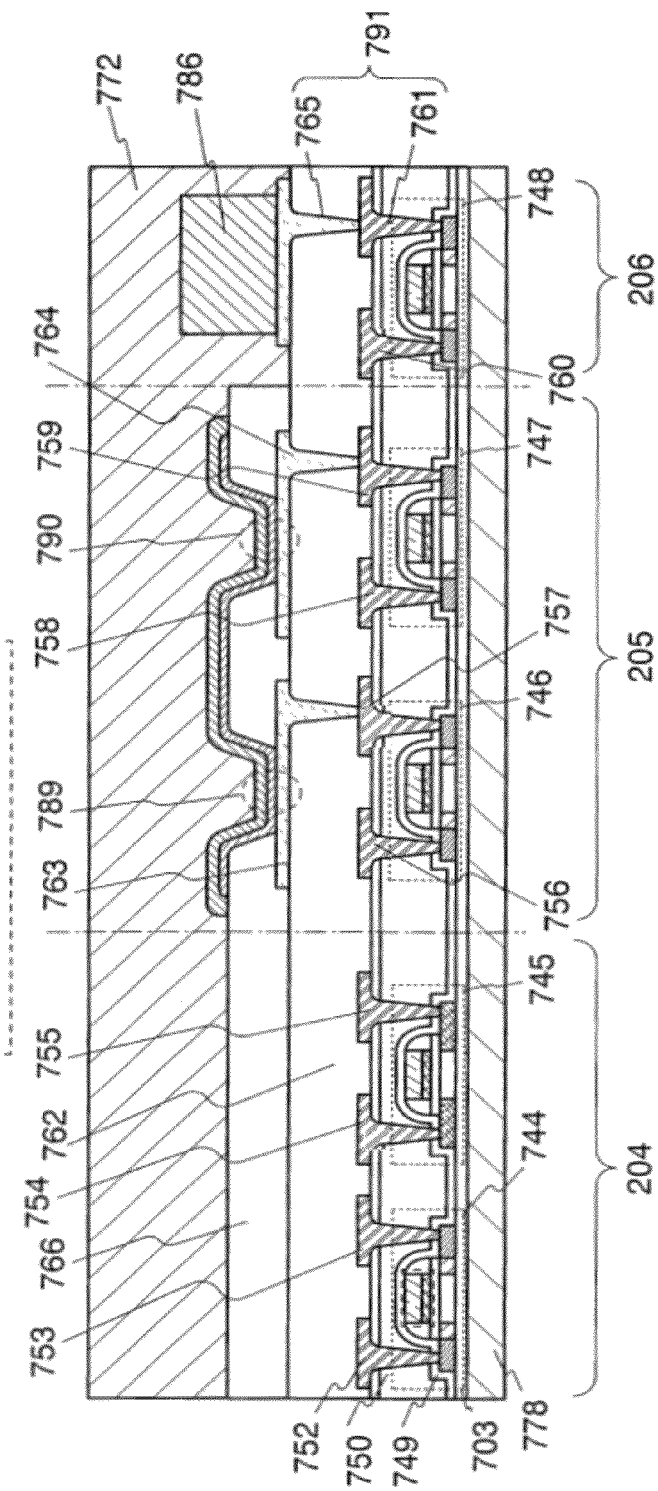

FIGS. 1A and 1B show a semiconductor device of this embodiment mode. Note that FIG. 1A illustrates an example of a top face structure of the semiconductor device shown in this embodiment mode, and FIG. 1B illustrates a part of a cross-sectional structure of FIG. 1A.

In this embodiment mode, a semiconductor device 200 includes an integrated circuit portion 201, a memory section 202 and an antenna 203 (FIG. 1A). In FIG. 1B, a region 204 corresponds to a part of the cross-sectional structure of the integrated circuit portion 201 of FIG. 1A, a region 205 corresponds to a part of the cross-sectional structure of the memory section 202 of FIG. 1A, and a region 206 corresponds to a part of the cross-sectional structure of the antenna 203 of FIG. 1A.

The semiconductor device of this embodiment mode includes thin film transistors (TFTs) 744 to 748 which are formed over a substrate 778 with an insulating layer 703 therebetween, an insulating layer 750 formed over the thin film transistors 744 to 748, and conductive layers 752 to 761 serving as source and drain electrodes formed over the insulating layer 750 as shown in FIG. 1B. In this embodiment mode, the insulating layer 703 is formed over the substrate 778 with an adhesive layer therebetween. Further, in this embodiment mode, there are no particular limitations on the material of the substrate 778, and a substrate having a thickness of about 2 µm to 20 µm is used.

In addition, the semiconductor device of this embodiment mode includes an insulating layer 762 formed over the insulating layer 750 and the conductive layers 752 to 761, conductive layers 763 to 765 formed over the insulating layer 762, an insulating layer 766 formed to cover parts of the insulating layer 762 and the conductive layer 763 to 765, storage element portions 789, 790 formed over the insulating layer 762, a conductive layer 786 serving as an antenna formed over the conductive layer 765, and an insulating layer 772 formed to cover the insulating layer 766, the conductive layer 771 and the conductive layer 786 serving as an antenna.

The insulating layer 772 in this embodiment mode is preferably formed using a resin (more preferably, epoxy resin). Epoxy resin is used as the insulating layer 772, so that the planarity of the surface of the insulating layer 772 is increased, the storage element portion and the element formation layer below the insulating layer 772 are protected from dusts and the like, and the mechanical strength of the semiconductor device can be held. Further, in the semiconductor device of this embodiment mode, since the insulating layer 772 can be used as a substrate covering the conductive layer serving as an antenna, a semiconductor device which is thin and bendable can be provided. Furthermore, in this embodiment mode, the insulating layer 772 may be formed such that the ratio of the thickness of the insulating layer 772 in a portion not covering the conductive layer 786 to the thickness of the conductive layer 786 serving as an antenna is at least 1.2, and the ratio of the thickness of the insulating layer 772 formed over the conductive layer 786 to the thickness of the conductive layer 786 is at least 0.2. Thus, the surface of the insulating layer 772 can have planarity enough to reduce damages to the element formation layer in the manufacturing process of the semiconductor device, and thus, a semiconductor device having mechanical strength enough to protect the storage element portion and the element formation layer can be obtained. Note that it is natural that the memory section and the integrated circuit portion shown in FIGS. 1A and 1B have a plurality of elements such as TFTs or capacitors.

In this embodiment mode, preferably, the conductive layer is not exposed in the side face of the semiconductor device. In other words, in the side face of the semiconductor device, the insulating layer covering the TFTs and the conductive layer is exposed. By employing such a structure, the present invention can provide a semiconductor device in which elements such as TFTs and an antenna can be protected from dusts and the like by only the insulating layer 772 and which does not easukt deteriorate.

Next, an example of a manufacturing process of the semiconductor device illustrated in FIGS. 1A and 1B is explained.

Figure 2A:
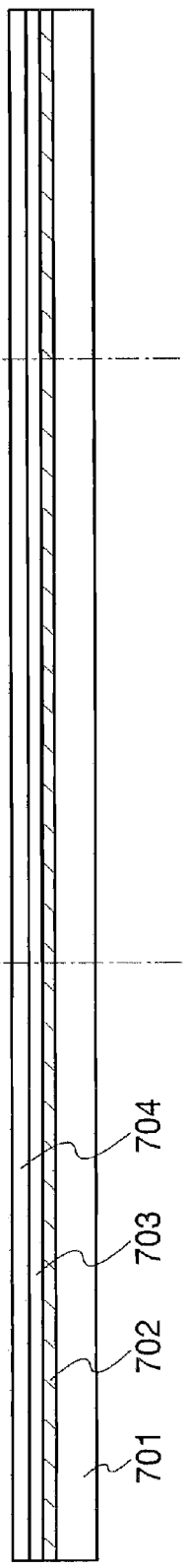
FIGS. 2A to 2C illustrate a process of manufacturing a semiconductor device according to an aspect of the present invention.

A separation layer 702 is formed over one surface of a first substrate 701 (see FIG. 2A). The first substrate 701 has an insulating surface. When the first substrate 701 is formed of glass, there are no particular limitations on the area and shape of the first substrate. Thus, as the first substrate 701, for example, a substrate having one side of one meter or longer and a rectangular shape is used to improve the productivity drastically. Such advantages are superior points to those of circular single crystal silicon substrates. In addition, when the substrate 701 is formed of plastic, plastics which can resist heat of a treatment in the manufacturing process are needed. Although described later, preferably, after a thin film transistor is formed over the first substrate 701 made of glass, the thin film transistor may be separated from the first substrate 701 and provided over a substrate made of plastic.

Note that in this manufacturing process, the separation layer 702 is formed over the entire surface of the first substrate 701; however, as necessary, the separation layer may be provided over the entire surface of the first substrate 701 and then patterned by a photolithography method to be selectively formed. Alternatively, the separation layer 702 is in contact with the first substrate 701; however, as necessary, an insulating layer serving as a base may be formed to be in contact with the first substrate 701, and the separation layer 702 may be formed to be in contact with the insulating layer.

The separation layer 702 is formed using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material or a compound material containing such an element as a main component to have a single layer structure or a laminated layer structure by a sputtering method, a plasma CVD method or the like. The crystal structure of a layer including silicon may be any of amorphous, microcrystal and polycrystal.

Next, an insulating layer 703 serving as a base is formed to cover the separation layer 702. As the insulating layer 703, a layer including an oxide or a nitride of silicon is formed by a method such as sputtering or CVD to have a single layer structure or a laminated layer structure. A oxide material of silicon is a substance containing silicon (Si) and oxygen (O) and corresponds to silicon oxide, silicon oxide containing nitrogen or the like. A nitride material of silicon is a substance containing silicon and nitrogen (N), and corresponds to silicon nitride, silicon nitride containing oxygen or the like. The insulating layer serving as a base functions as a blocking film for preventing impurities from entering from the first substrate 701.

Figure 2B:
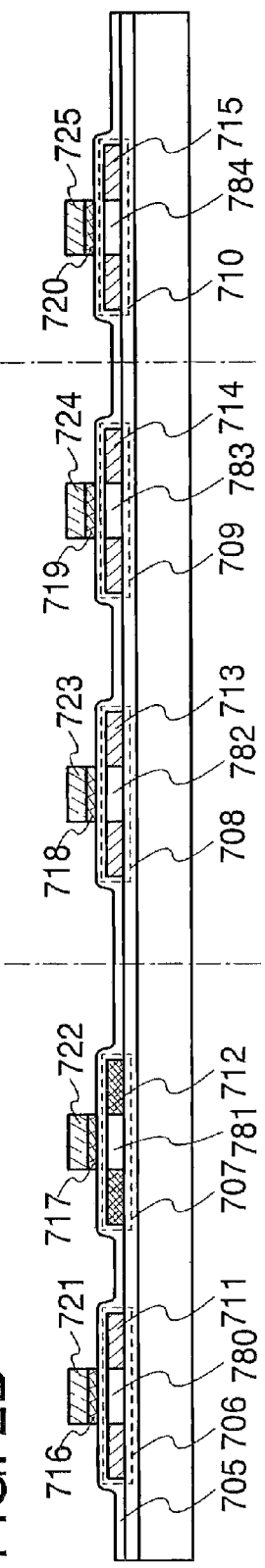

Subsequently, an amorphous semiconductor layer 704 is formed over the insulating layer 703. The amorphous semiconductor layer 704 is formed by a sputtering method, an LPCVD method, a plasma CVD method, or the like. Subsequently, the amorphous semiconductor layer 704 is crystallized by a crystallization method (such as a laser crystallization method, a thermal crystallization method using RTA or an annealing furnace, a thermal crystallization method using a metal element which promotes crystallization, or a combination of a thermal crystallization method using a metal element which promotes crystallization and a laser crystallization method) to form a crystalline semiconductor layer. Thereafter, the obtained crystalline semiconductor layer is patterned into a desired shape to form crystalline semiconductor layers 706 to 710 (see FIG. 2B).

An example of a manufacturing process of the crystalline semiconductor layers 706 to 710 is explained below. First, an amorphous semiconductor layer is formed using a plasma CVD method. After applying a solution containing nickel which is a metal element for promoting crystallization so as to reside over the amorphous semiconductor layer, the amorphous semiconductor layer is subjected to a dehydrogenating treatment (500° C. for one hour) and a thermal crystallization treatment (550° C. for four hours) to form a crystalline semiconductor layer. Thereafter, the crystalline semiconductor layer is irradiated with a laser beam, if required, and pattered by a photolithography method to form the crystalline semiconductor layers 706 to 710.

In forming the crystalline semiconductor layer by a laser crystallization method, a gas laser or a solid state laser can be used. The gas laser or the solid state layer may be a continuous wave laser or a pulsed laser. As a laser beam which can be used here, for example, a beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG; $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser, can be used. Irradiation of a laser beam of a fundamental wave of such lasers or a second to fourth harmonic of such a fundamental wave can give a crystal with a large grain size.

Note that each laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; and a Ti:sapphire laser, can continuously oscillate. Further, pulse oscillation thereof can be performed with a repetition rate of 10 MHz or more by performing Q switch operation or mode locking. When a laser beam is oscillated at a repetition rate of 10 MHz or more or a CW layer beam is oscillated, the surface of the crystallized semiconductor layer can be leveled. Thus, a gate insulating layer to be formed later can be thinned, thereby providing a thinner-mode semiconductor device. Thus, the withstand voltage of a gate insulating layer can be improved.

The crystallization of the amorphous semiconductor layer using a metal element for promoting crystallization has the advantages of enabling crystallization at a low temperature in a short time and aligning a direction of crystals; on the other hand, the crystallization has a disadvantage that off current is increased due to the metal element remaining in the crystalline semiconductor layer and characteristics of the crystalline semiconductor layer are not stabilized. Therefore, an amorphous semiconductor layer serving as a gettering site is preferably formed over the crystalline semiconductor layer. Since the amorphous semiconductor layer serving as a gettering site should contain an impurity element such as phosphorus or argon, the amorphous semiconductor layer is preferably formed by a sputtering method by which the amorphous semiconductor layer can contain argon at high concentration. Then, a heat treatment (thermally annealing using an RTA method, an annealing furnace, or the like) is performed to diffuse the metal element into the amorphous semiconductor layer. Subsequently, the amorphous semiconductor layer containing the metal element is removed. This makes it possible to reduce or remove the metal element contained in the crystalline semiconductor layer.

Next, a gate insulating layer 705 is formed to cover the crystalline semiconductor layers 706 to 710. The gate insulating layer 705 is formed by using a single layer or a laminated layer of a film containing an oxide and/or a nitride of silicon by a CVD method, a sputtering method, or the like. In addition, the gate insulating layer may be formed by performing a high-density plasma treatment on the crystalline semiconductor layers 706 to 710 and oxidizing or nitriding the surface. For example, the gate insulating layer 705 is formed by a plasma treatment with an introduced mixed gas of a rare gas such as He, Ar, Kr, or Xe and oxygen, nitrogen oxide ($NO_2$), ammonia, nitrogen, hydrogen, or the like. When plasma excitation in this case is performed by introducing a microwave, high-density plasma can be produced at low electron temperature. The surface of the semiconductor layers can be oxidized or nitrided with an oxygen radical (which may include an OH radical) or a nitrogen radical (which may include an NH radical) that is produced by the high-density plasma.

By a treatment using such high-density plasma, an insulating layer with a thickness of 1 nm to 20 nm, typically, 5 nm to 10 nm, is formed over the semiconductor layers. A reaction in this case is a solid-phase reaction; therefore, the interface state density between the insulating layer and the semiconductor layers can be extremely lowered. Since such a high-density plasma treatment directly oxidizes (or nitrides) the semiconductor layers (of crystalline silicon or polycrystalline silicon), variation in thickness of the insulating layer to be formed can be ideally suppressed significantly. Furthermore, oxidation is not performed strongly also at a crystal grain boundary of crystalline silicon, which leads to an extremely preferable state. In other words, when each surface of the semiconductor layers is subjected to solid-phase oxidation by the high-density plasma treatment shown here, an insulating layer with low interface state density and favorable uniformity can be formed without causing abnormal oxidation reaction at a crystal grain boundary. Accordingly, a semiconductor device which is thinner and has better characteristics can be provided.

As the gate insulating layer, only an insulating layer formed by a high-density plasma treatment may be used. Alternatively, an insulating layer of silicon oxide, silicon oxynitride, or silicon nitride may be deposited or laminated thereover by a CVD method utilizing plasma or a thermal reaction. In either case, by forming the gate insulating layer of a transistor to include partially or wholly such an insulating layer formed with high-density plasma, the transistor can have reduced variations in characteristics. Accordingly, a semiconductor device which is thinner and has better characteristics can be provided.

The crystalline semiconductor layers 706 to 710, which are formed by crystallizing the semiconductor layer by irradiation with a continuous wave laser beam or a laser beam oscillated at a repetition rate of 10 MHz or more, scanning the semiconductor layer with the laser beam in one direction, have a feature that crystals grow in the scanning direction of the laser beam. When transistors are arranged such that the scanning direction is aligned with each a channel length direction (a direction in which carries flow when a channel formation region is formed) and the transistors are combined with the gate insulating layer, the transistors (TFTs) with little variation in characteristics and high electron field-effect mobility can be obtained.

Next, a first conductive layer and a second conductive layer are laminated over the gate insulating layer 705. The first conductive layer is formed by a plasma CVD method, a sputtering method, or the like with a thickness of 20 nm to 100 nm. The second conductive layer is formed by a known method with a thickness of 100 nm to 400 nm. The first conductive layer and the second conductive layer are formed with an element such as tantalum (Ta), tungsten (W), titanium (Ti), molybdenum (Mo), aluminum (Al), copper (Cu), chromium (Cr), or the like; or an alloy material or a compound material containing such an element as its main component. Alternatively, the first conductive layer and the second conductive layer are formed with semiconductor materials typified by polycrystalline silicon doped with an impurity element such as phosphorus. As an example of a combination of the first conductive layer and the second conductive layer, a layer including tantalum nitride and a layer including tungsten, a layer including tungsten nitride and a layer including tungsten, a layer including molybdenum nitride and a layer including molybdenum, or the like can be given. Since tungsten and tantalum nitride have high heat resistance, a heat treatment for thermal activation can be performed after forming the first conductive layer and the second conductive layer. In the case of employing not a two-layer structure but a three-layer structure, a laminated structure of a molybdenum layer, an aluminum layer, and a molybdenum layer may be employed.

Next, a mask of resist is formed using a photolithography method and an etching treatment for forming a gate electrode and a gate line is performed to form conductive layers 716 to 725 functioning as gate electrodes.

Then, a mask of resist is formed by a photolithography method and an impurity element which imparts N-type conductivity is added to the crystalline semiconductor layers 706 and 708 to 710 at low concentration by an ion doping method or an ion implantation method to form impurity regions 711 and 713 to 715 and channel formation regions 780 and 782 to 784. As the impurity element which imparts N-type conductivity, an element belonging to Group 15 may be used and, for example, phosphorus (P) or arsenic (As) is used.

Then, a mask of resist is formed by a photolithography method and an impurity element which imparts P-type conductivity is added to the crystalline semiconductor layer 707 to form an impurity region 712 and a channel formation region 781. As the impurity element which imparts P-type conductivity, for example, boron (B) is used.

Figure 2C:
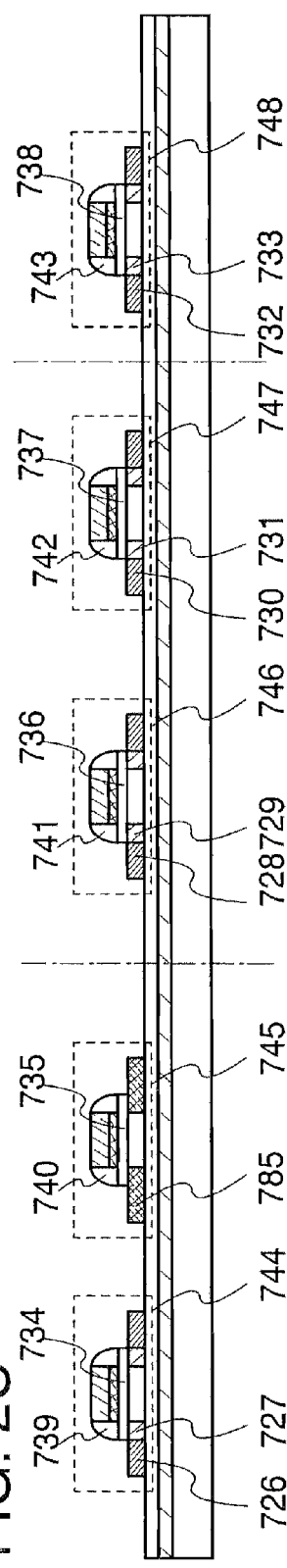

Next, an insulating layer is formed to cover the gate insulating layer 705 and the conductive layers 716 to 725. The insulating layer is formed by using a single layer or a laminated layer of a layer containing an inorganic material such as silicon, an oxide and/or a nitride of silicon or a layer containing an organic material such as an organic resin by a plasma CVD method, a sputtering method, or the like. Next, the insulating layer is selectively etched by anisotropic etching, in which etching is performed mainly in a perpendicular direction, to form insulating layers (also referred to as sidewalls) 739 to 743 in contact with side faces of the conductive layers 716 to 725 (see FIG. 2C). At the same time as the manufacturing of the insulating layers 739 to 743, the insulating layer 705 is etched to form insulating layers 734 to 738. The insulating layers 739 to 743 are used as masks for doping when forming LDD (lightly doped drain) regions later.

Subsequently, a mask of resist is formed by a photolithography method, an impurity element which imparts N-type conductivity is added to the crystalline semiconductor layers 706 and 708 to 710 to form first impurity regions 727, 729, 731, and 733 serving as LDD (Lightly Doped Drain) regions and second impurity regions 726, 728, 730, and 732, using the mask of resist and the insulating layers 739 to 743 as masks. The concentration of the impurity element contained in the first impurity regions 727, 729, 731, and 733 is lower than that in the second impurity regions 726, 728, 730, and 732. Through the above steps, N-channel thin film transistors 744 and 746 to 748 and a P-channel thin film transistor 745 are completed.

Subsequently, a single layer or laminated layer of an insulating layer is formed to cover the thin film transistors 744 to 748 (FIG. 3A). The insulating layer covering the thin film transistors 744 to 748 is formed by an SOG method, a droplet discharge method, or the like with a single layer or a laminated layer of an inorganic material such as an oxide and/or a nitride of silicon, an organic material such as polyimide, polyamide, benzocyclobutene, acrylic, epoxy, or siloxane, or the like. Siloxane is a resin containing Si—O—Si bond. Siloxane has a skeleton structure including a bond of silicon (Si) and oxygen (O). As a substituent, an organic group including at least hydrogen (for example, an alkyl group, and aromatic hydrocarbon) is used. Further, a fluoro group may be used as a substituent.

For example, in the case where the insulating layer covering the thin film transistors 744 to 748 has a three-layer structure, a layer containing silicon oxide may be formed as a first insulating layer 749, a layer containing a resin may be formed as a second insulating layer 750, and a layer containing silicon nitride may be formed as a third insulating layer 751.

Note that a heat treatment for recovering crystallinity of the semiconductor layers, activating the impurity elements added to the semiconductor layers, or hydrogenating the semiconductor layers, is preferably performed before forming the insulating layers 749 to 751 or after forming one or a plurality of the insulating layers 749 to 751. The heat treatment may be a thermal annealing method, a laser annealing method, an RTA method, or the like.

Next, the insulating layers 749 to 751 are etched by a photolithography method to form opening portions which expose the second impurity regions 726, 728, 730, 732 and the impurity region 785. Subsequently, a conductive layer is formed to fill the opening portion as shown in FIG. 3A. The conductive layer is patterned to form conductive layers 752 to 761 functioning as source and drain wirings.

The conductive layers 752 to 761 are formed by a CVD method, a sputtering method, or the like with a single layer or a laminated layer of an element such as titanium (Ti), aluminum (Al), or neodymium (Nd), or an alloy material or a compound material containing such an element as its main component. The alloy material containing aluminum as its main component corresponds to, for example, a material containing aluminum as its component and nickel, a material containing aluminum as its component and silicon, or a material containing aluminum as its component and one or more of nickel, carbon and silicon. The conductive layers 752 to 761 may have, for example, a laminated structure of a barrier layer, an aluminum layer containing silicon, and a barrier layer or a laminated structure of a barrier layer, an aluminum layer containing silicon, a titanium nitride (EN) layer, and a barrier layer. In addition, silicon contained aluminum silicon is contained at 0.1 wt % to 5 wt %. Note that the barrier layer corresponds to a thin film of titanium, nitride of titanium, molybdenum, or nitride of molybdenum. An aluminum layer and an aluminum layer containing silicon have low resistance and are inexpensive, which are optimum for materials of the conductive layers 752 to 761. When upper and lower barrier layers are provided, generation of a hillock of aluminum or aluminum silicon can be prevented. By forming the barrier layer of titanium that is an element having a high reducing property, even when a thin natural oxide film is formed on the crystalline semiconductor layer, the natural oxide film can be reduced, so that occurrence of defective connection between the crystalline semiconductor layer and the barrier layer can be suppressed.

Next, an insulating layer 762 serving as a protective film is formed to cover the conductive layers 752 to 761 (FIG. 3B). The insulating layer 762 is formed with a single layer or a laminated layer of an inorganic material or an organic material (preferably epoxy resin) by an SOG method, a droplet discharge method, or the like. In addition, the insulating layer 762 is preferably formed with a thickness of 0.75 µm to 3 µm.

Subsequently, the insulating layer 762 is etched by a photolithography method to form opening holes which expose the conductive layers 757, 759, and 761. Then, a conductive layer is formed to fill the opening holes. The conductive layer is formed of a conductive material using a plasma CVD method, a sputtering method, or the like. Next, the conductive layer is patterned to form conductive layers 763, 764, 765 connected to the conductive layers 757, 759, 761 respectively. Note that each of the conductive layers 763 and 764 serves as one of a pair of conductive layers included in a storage element portion. Consequently, the conductive layers 763 to 765 are preferably formed with a single layer or a laminated layer of titanium or an alloy material or a compound material containing titanium as its main component. Titanium has low resistance, which leads to a reduction in size of the storage element portion and achievement of higher integration. In a photolithography process to form the conductive layers 763 to 765, wet etching processing is preferably performed so as not to damage the thin film transistors 744 to 748 therebelow, and hydrogen fluoride (HF) or ammonia-peroxide solution is preferably used as an etching agent (etchant).

Next, an insulating layer 766 is formed to cover the conductive layers 763 to 765. The insulating layer 766 is formed with a single layer or a laminated layer of an inorganic material or an organic material by an SOG method, a droplet discharge method, or the like. The insulating layer 766 is preferably formed with a thickness of 0.75 µm to 3 µm. Subsequently, the insulating layer 766 is etched by a photolithography method to form opening portions 767 to 769 which expose the conductive layers 763 to 765.

Figure 4A:
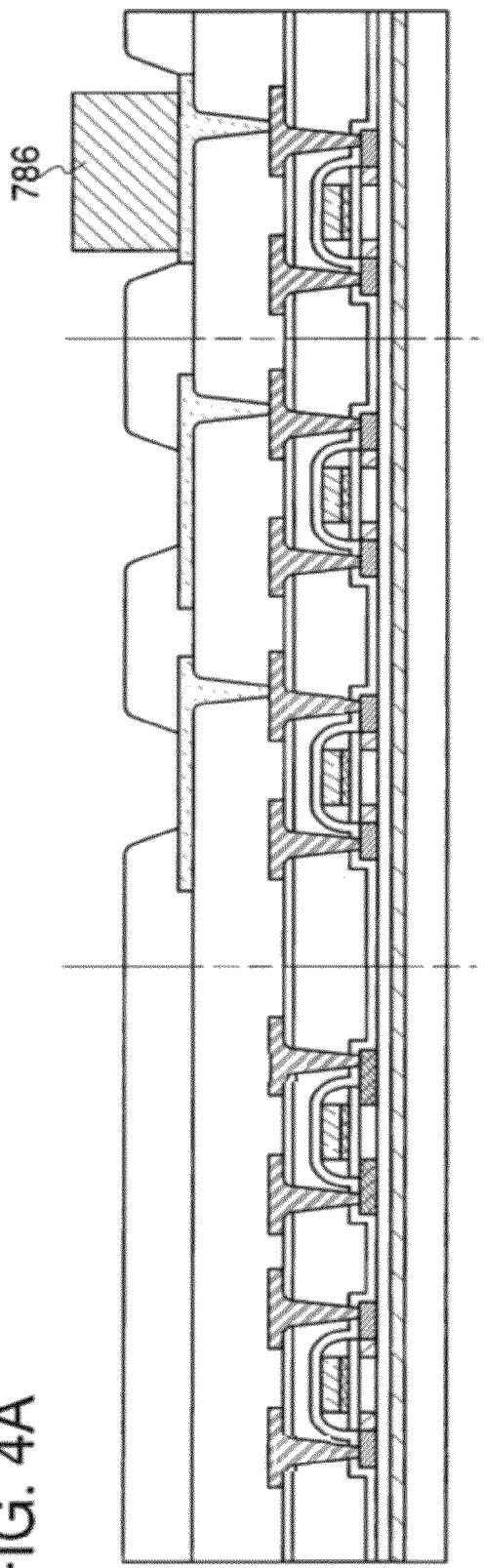
FIGS. 4A and 4B illustrate a process of manufacturing a semiconductor device according to an aspect of the present invention.

Next, a conductive layer 786 functioning as an antenna is formed in contact with the conductive layer 765 (see FIG. 4A). The conductive layer 786 is formed of a conductive material by a CVD method, a sputtering method, a printing method, a droplet discharge method, or the like. Preferably, the conductive layer 786 is formed with a single layer or a laminated layer of an element such as aluminum (Al), titanium (Ti), silver (Ag), or copper (Cu), or an alloy material or a compound material containing such an element as its main component. Specifically, an aluminum layer is formed by a sputtering method and patterned to form the conductive layer 786. The aluminum layer may be patterned by wet etching processing, and after the wet etching, a heat treatment may be performed at a temperature of 200° C. to 300° C.

Figure 4B:
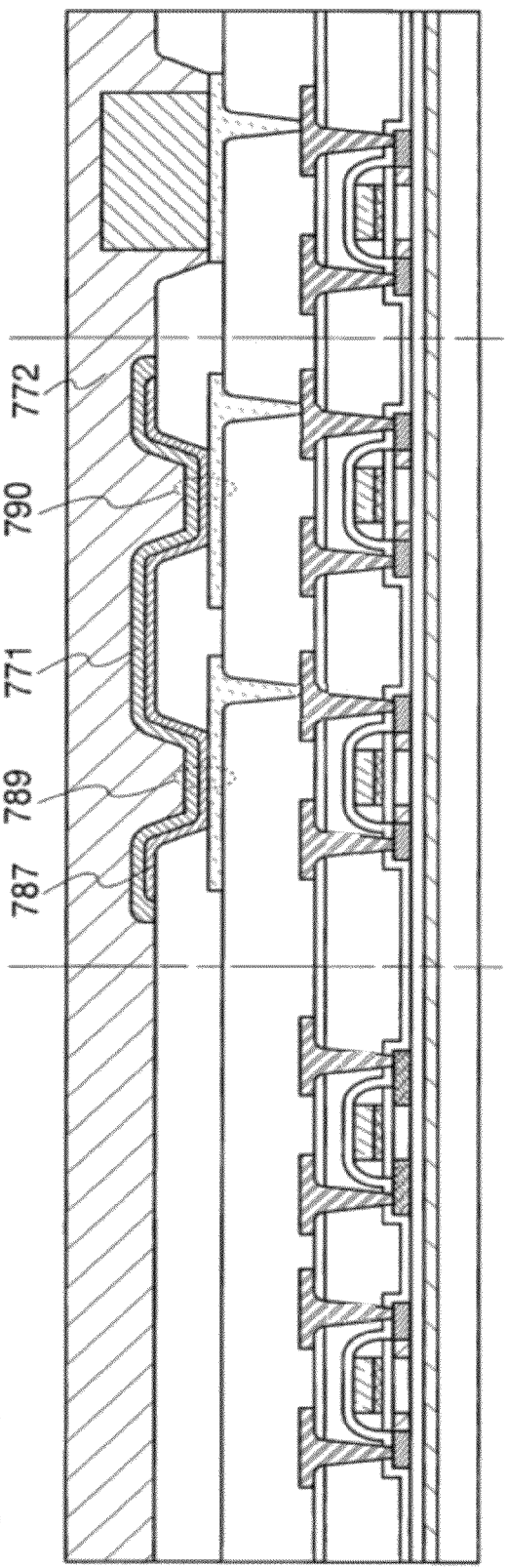

Next, an organic compound-containing layer 787 is formed to be in contact with the conductive layers 763 and 764 (FIG. 4B). The organic compound-containing layer 787 is formed by a droplet discharge method, an evaporation method, or the like. Subsequently, a conductive layer 771 is formed to be in contact with the organic compound-containing layer 787. The conductive layer 771 is formed by a sputtering method, an evaporation method, or the like.

As an organic material used for the organic compound-containing layer, for example, an aromatic amine-based compound (that is, a compound having a benzene ring-nitrogen bond) such as 4,4'-bis[N-(1-naphthyl)-N-phenylanimo]biphenyl (abbreviation: α-NPD), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis(N-{4-[N'-(3-methylphenyl)-N'-phenylamino]phenyl}-N-phenylamino)biphenyl (abbreviation: DNTPD), polyvinyl carbazole (abbreviation: PVK), a phthalocyanine compound such as phthalocyanine (abbreviation: $H_2Pc$), copper phthalocyanine (abbreviation: CuPc), or vanadyl phthalocyanine (abbreviation: VOPc), or the like can be used. These materials have high hole transporting properties.

Besides, a material formed of a metal complex or the like having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq), a material formed of a metal complex or the like having an oxazole-based or thiazole-based ligand such as bis[2-(2-hydroxyphenyl)benzoxazolato]zinc (abbreviation: $Zn(BOX)_2$), or bis[2-(2-hydroxyphenyl)benzothiazolato]zinc (abbreviation: $Zn(BTZ)_2$), or the like can be used. These materials have high electron transporting properties.

Other than the metal complexes, a compound or the like such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used.

The memory material layer may have a single-layer structure or a laminated structure. In the case of a laminated structure, materials can be selected from the aforementioned materials to form a laminated structure. Further, the aforementioned organic material and a light emitting material may be laminated. As the light emitting material, 4-dicyanomethylene-2-methyl-6-[2-(1,1,7,7-tetramethyl-2,3,6,7-tetrahydro-1H,5H-benzo[ij]quinolizin-9-yl)ethenyl]-4H-pyran (abbreviation: DOT), 4-dicyanomethylene-2-t-butyl-6-[2-(1,1,7,7-tetramethyljulolidin-9-yl)ethenyl]-4H-pyran, periflanthene, 2,5-dicyano-1,4-bis[2-(10-methoxy-1,1,7,7-tetramethyljulolidin-9-yl)ethenyl]benzene, N,N'-dimethylquinacridone (abbreviation: DMQd), coumarin 6, coumarin 545T, tris(8-quinolinolato)aluminum (abbreviation: $Alq_3$), 9,9'-bianthryl, 9,10-diphenylanthracene (abbreviation: DPA), 9,10-bis(2-naphthyl)anthracene (abbreviation: DNA), 2,5,8,11-tetra-t-buthylperylene (abbreviation: TBP), or the like can be used.

A layer in which the above light emitting material is dispersed may be used. In the layer in which the above light emitting material is dispersed, an anthracene derivative such as 9,10-di(2-naphthyl)-2-tert-butylanthracene (abbreviation: t-BuDNA), a carbazole derivative such as 4,4'-di(N-carbazolyl)biphenyl (abbreviation: CBP), a metal complex such as bis[2-(2-hydroxyphenyl)pyridinato]zinc (abbreviation: $Znpp_2$) or bis[2-(2-hydroxyphenyl)benzoxazolato]zinc (abbreviation: ZnBOX), or the like can be used as a base material. In addition, tris(8-quinolinolato)aluminum (abbreviation: $Alq_3$), 9,10-bis(2-naphthyl)anthracene (abbreviation: DNA), bis(2-methyl-8-quinolinolato)-4-phenylphenolato-aluminum (abbreviation: BAlq), or the like can be used.

The property of such an organic material is changed by a thermal effect or the like; therefore, a glass transition temperature (Tg) thereof is preferably 50° C. to 300° C., more preferably, 80° C. to 120° C.

In addition, a material in which metal oxide is mixed with an organic material or a light emitting material may be used. Note that the material in which metal oxide is mixed includes a state in which metal oxide is mixed or stacked with the above organic material or the above light emitting material. Specifically, it indicates a state which is formed by a co-evaporation method using plural evaporation sources. Such a material can be referred to as an organic-inorganic composite material.

For example, in the case of mixing a substance having a high hole transporting property with metal oxide, it is preferable to use vanadium oxide, molybdenum oxide, niobium oxide, rhenium oxide, tungsten oxide, ruthenium oxide, titanium oxide, chromium oxide, zirconium oxide, hafnium oxide, or tantalum oxide as the metal oxide.

In the case of mixing a substance having a high electron transporting property with metal oxide, it is preferable to use lithium oxide, calcium oxide, sodium oxide, potassium oxide, or magnesium oxide as the metal oxide.

A material of which property changes by an electrical effect, an optical effect, or a thermal effect may be used for the memory material layer; therefore, for example, a conjugated high molecular compound doped with a compound (photoacid generator) which generates acid by absorbing light can also be used. As the conjugated high molecular compound, polyacetylenes, polyphenylene vinylenes, polythiophenes, polyanilines, polyphenylene ethinylenes, or the like can be used. As the photoacid generator, aryl sulfonium salt, aryl iodonium salt, o-nitrobenzyl tosylate, aryl sulfonic acid p-nitrobenzyl ester, sulfonyl acetophenones, Fe-arene complex PF6 salt, or the like can be used.

Note that the example of using an organic compound material for the storage element portions 789 and 790 is described here, but the present invention is not limited thereto. For example, a phase change material such as a material which changes reversibly between a crystalline state and an amorphous state or a material which changes reversibly between a first crystalline state and a second crystalline state can be used. Further, a material which changes only from an amorphous state to a crystalline state can be used.

The material which reversibly changes between a crystalline state and an amorphous state is a material containing a plurality of elements selected from the group consisting of germanium (Ge), tellurium (Te), antimony (Sb), sulphur (S), tellurium oxide (TeOx), tin (Sn), gold (Au), gallium (Ga), selenium (Se), indium (In), thallium (Tl), cobalt (Co), and silver (Ag). For example, a material based on Ge—Te—Sb—S, Te—TeO$_2$—Ge—Sn, Te—Ge—Sn—Au, Ge—Te—Sn, Sn—Se—Te, Sb—Se—Te, Sb—Se, Ga—Se—Te, Ga—Se—Te—Ge, In—Se, In—Se—Tl—Co, Ge—Sb—Te, In—Se—Te, or Ag—In—Sb—Te may be used. The material which reversibly changes between the first crystalline state and the second crystalline state is a material containing a plurality of elements selected from the group consisting of silver (Ag), zinc (Zn), copper (Cu), aluminum (Al), nickel (Ni), indium (In), antimony (Sb), selenium (Se), and tellurium (Te), for example, Ag—Zn, Cu—Al—Ni, In—Sb, In—Sb—Se, In—Sb—Te. When using such a material, a phase change is carried out between two different crystalline states. The material which changes only from an amorphous state to a crystalline state is a material containing a plurality of elements selected from the group consisting of tellurium (Te), tellurium oxide (TeO$_x$), palladium (Pd), antimony (Sb), selenium (Se), and bismuth (Bi), for example, Te—TeO$_2$, Te—TeO$_2$—Pd, or Sb$_2$Se$_3$/Bi$_2$Te$_3$.

Through the above described steps, the storage element portions 789, 790 are completed. The storage element portion 789 has a laminated structure of the conductive layer 763, the organic compound-containing layer 787 and the conductive layer 771, and the storage element portion 790 has a laminated structure of the conductive layer 764, the organic compound-containing layer 787 and the conductive layer 771 (FIG. 4B).

Then, an insulating layer 772 serving as a substrate for protection is formed so as to cover the storage element portions 789, 790 and the conductive layer 786 serving as an antenna (FIG. 4B). The insulating layer 772 can be formed using any material as long as it has a function of preventing a layer including a TFT from being damaged in a separation step described later, without particular limitation; however, the insulating layer 772 is preferably formed using resin (more preferably epoxy resin). Epoxy resin is used as the insulating layer 772 to improve planarity on the surface of the insulating layer 772, reduce damages to the layer including a TFT in the later separation step, protect the storage element portion and the element formation layer below the insulating layer 772 from dusts and the like, and keep the mechanical strength of the semiconductor device. In the semiconductor device of this embodiment mode, the insulating layer 772 can be used as a substrate covering the conductive layer 786 serving as an antenna. Thus, a semiconductor device which is thin and bendable can be provided. Furthermore, in this embodiment mode, the insulating layer 772 may be formed such that the ratio of the thickness of the insulating layer 772 in a portion not covering the conductive layer 786 to the thickness of the conductive layer 786 serving as an antenna is at least 1.2, and the ratio of the thickness of the insulating layer 772 formed over the conductive layer 786 serving as an antenna to the thickness of the conductive layer 786 is at least 0.2. As a result, it is possible that the surface of the insulating layer 772 has planarity enough to reduce damages to the element formation layer in the manufacturing process of the semiconductor device, and thus, a semiconductor device having mechanical strength enough to protect the storage element portion and the element formation layer can be provided.

It is to be noted that in this embodiment mode, the layer including the thin film transistors 744 to 748 and the conductive layers 752 to 761 is referred to as an element formation layer 791, and the layer including the storage element portions 789, 790 and the conductive layer 786 serving as an antenna is referred to as a region 792. Preferably, the thickness of the layers below the conductive layer 786 serving as an antenna, excluding the substrate 701, is 5 μm or less, preferably 0.1 μm to 3 μm. Although not shown here, in the element formation layer 791, elements such as a diode, a TFT, a capacitor, and a resistor which constitute the memory section 202 and the integrated circuit portion 201 are formed.

Figure 5A:
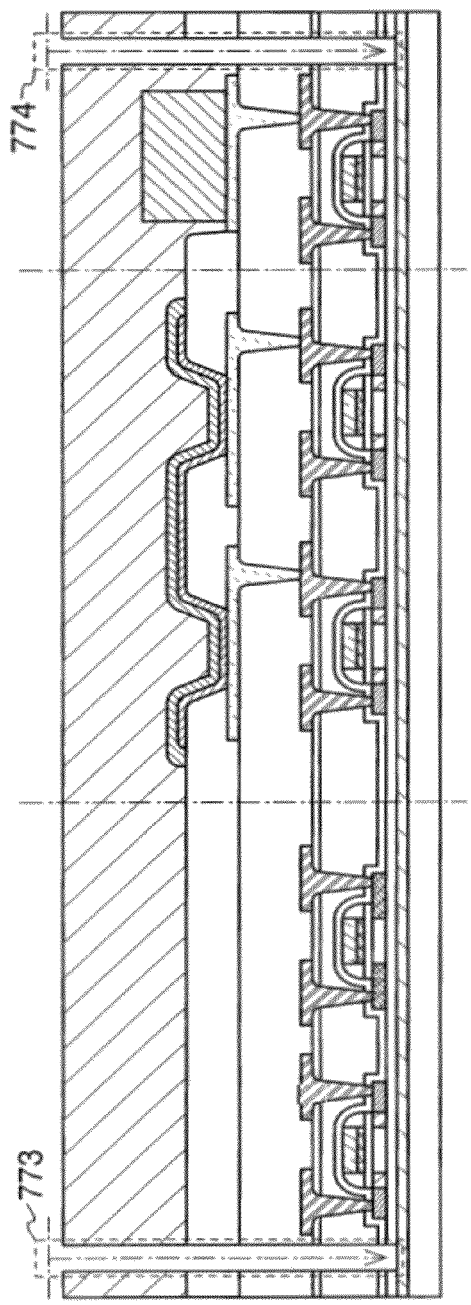
FIGS. 5A and 5B illustrate a process of manufacturing a semiconductor device according to an aspect of the present invention.

Then, the insulating layers 703, 749, 750, 751 and 772 are etched by a dicer, a laser, a wire saw or the like, so as to expose a part of the surface of the separation layer 702, thereby forming opening portions 773 and 774 (see FIG. 5A).

Next, an etching agent is introduced into the opening portions 773, 774 to remove the separation layer 702 (FIG. 5A). As the etching agent, a gas or a liquid containing halogen fluoride is used. For example, chlorine trifluoride (ClF$_3$), nitrogen trifluoride (NF$_3$), bromine trifluoride (BrF$_3$), and hydrogen fluoride (HF) are given. Note that when hydrogen fluoride is used as the etching agent, a layer including silicon oxide is used as the separation layer 702. The layer including the thin film transistors 744 to 748 is separated from the first substrate 701.

The first substrate 701 from which the element formation layer 791 including the thin film transistors 744 to 748 is separated may be reused for the sake of cost reduction. In addition, the insulating layer 772 is provided so that the element formation layer 791 is not stripped after the separation layer 702 is removed. Since the element formation layer 791 is thin and light, the element formation layer 791 is not attached closely to the first substrate 701 and thus, easy to be stripped after the separation layer 702 is removed. However, the insulating layer 722 is formed over the element formation layer 791 to increase the weight of the element formation layer 791, thereby preventing the element formation layer 791 from being scattered from the first substrate 701. In addition, the element formation layer 791 itself is thin and light; however, as the result of forming the insulating layer 772, the element formation layer 791 is not warped and thus, can have a certain level of strength.

Figure 5B:
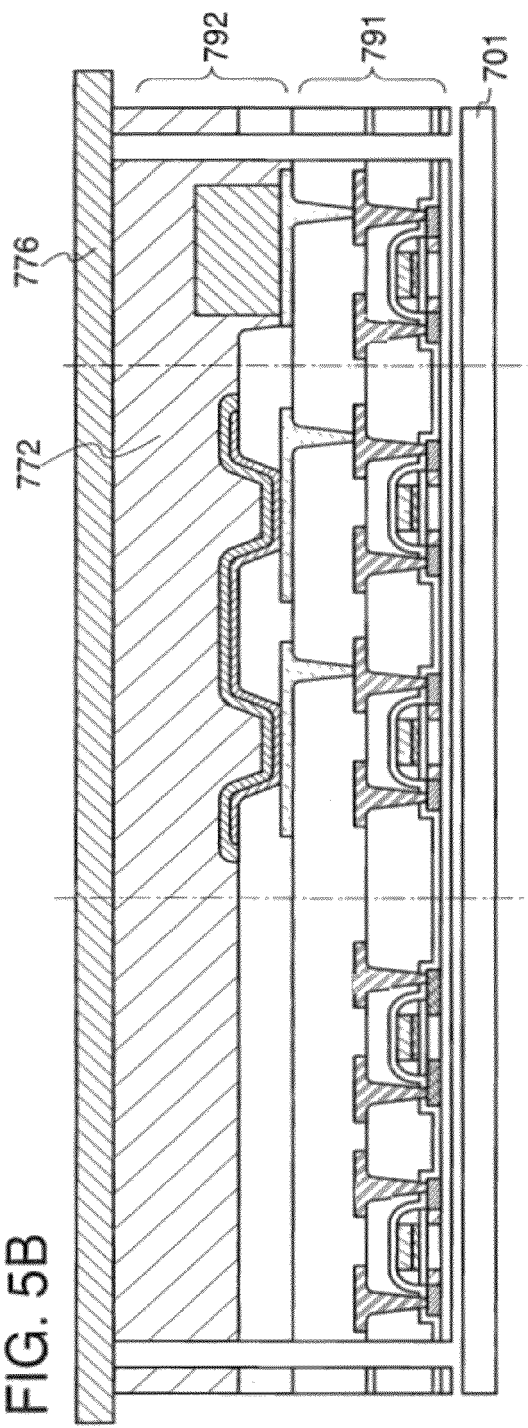

Next, the insulating layer 772 is bonded to a sheet member 776 to be completely separated from the first substrate 701 (see FIG. 5B). Here, the sheet member 776 may be a material which has high adhesiveness in a normal state but low adhesiveness when it is applied with heat and irradiated with light. For example, a heat-peeling tape whose adhesiveness is weakened by heat, a UV-peeling tape whose adhesiveness is weakened by ultraviolet rays, or the like may be used. In addition, a low-viscosity tape having low adhesiveness in a normal state may be used, for example.

Next, a second substrate 778 is fixed on the insulating layer 703. Here, the second substrate 778 corresponds to a film obtained by stacking an adhesive synthetic resin film (e.g., acrylic synthetic resin or epoxy-based synthetic resin) and any of a film made of polypropylene, polyester, vinyl, polyvinyl fluoride, vinyl chloride, or the like; paper made of a fibrous material; and a base film (e.g., polyester, polyamide, inorganic deposited film, or paper). Preferably, the thickness of the second substrate 778 is in the range of about 2 μm to 20 μm. With the use of the second substrate 778 made of plastic, a device using the second substrate 778 is thin, light, and bendable, which leads to the use for various designs and easy processing into a flexible shape. Such a device has a high-impact resistance, and is easy to be attached or embedded into various goods, which allows application to wide variety of fields.

In this embodiment mode, an adhesive layer is provided for the surface of the second substrate 778, on the insulating layer 703 side. The adhesive layer corresponds to a layer including an adhesive such as a heat curing resin, an ultraviolet curing resin, a vinyl acetate resin-based adhesive, a vinyl copolymer resin-based adhesive, an epoxy resin-based adhesive, an urethane resin-based adhesive, a rubber-based adhesive, or an acrylic resin-based adhesive.

In this embodiment mode, a thick support 779 having a larger thickness than the second substrate 778 is provided for the surface of the second substrate 778, not on the insulating layer 703 side. In this embodiment mode, since the second substrate 778 has a small thickness of about 2 μm to 20 μm, it is difficult to be handled. However, the support 779 is provided for the second substrate 778 so that the second substrate 778 can be easily handled. Note that the support 779 is removed at the end of the process. In this embodiment mode, the second substrate 778 has the support 779, so that a substrate having extremely thin thickness can be used as the second substrate 778.

Note that the surface of the second substrate 778 may be coated with silicon dioxide (silica) powder. The coating allows the surface to be kept water-resistant even in an environment of high temperature and high humidity. Moreover, the surface may be coated with a conductive material such as indium tin oxide, so that the material coating the surface charges static electricity, and thus a thin film integrated circuit can be protected from static electricity. The surface may also be coated with a material containing carbon as its main component (such as diamond like carbon). The coating increases the strength and can prevent the degradation or destruction of a semiconductor device.

Figure 6:
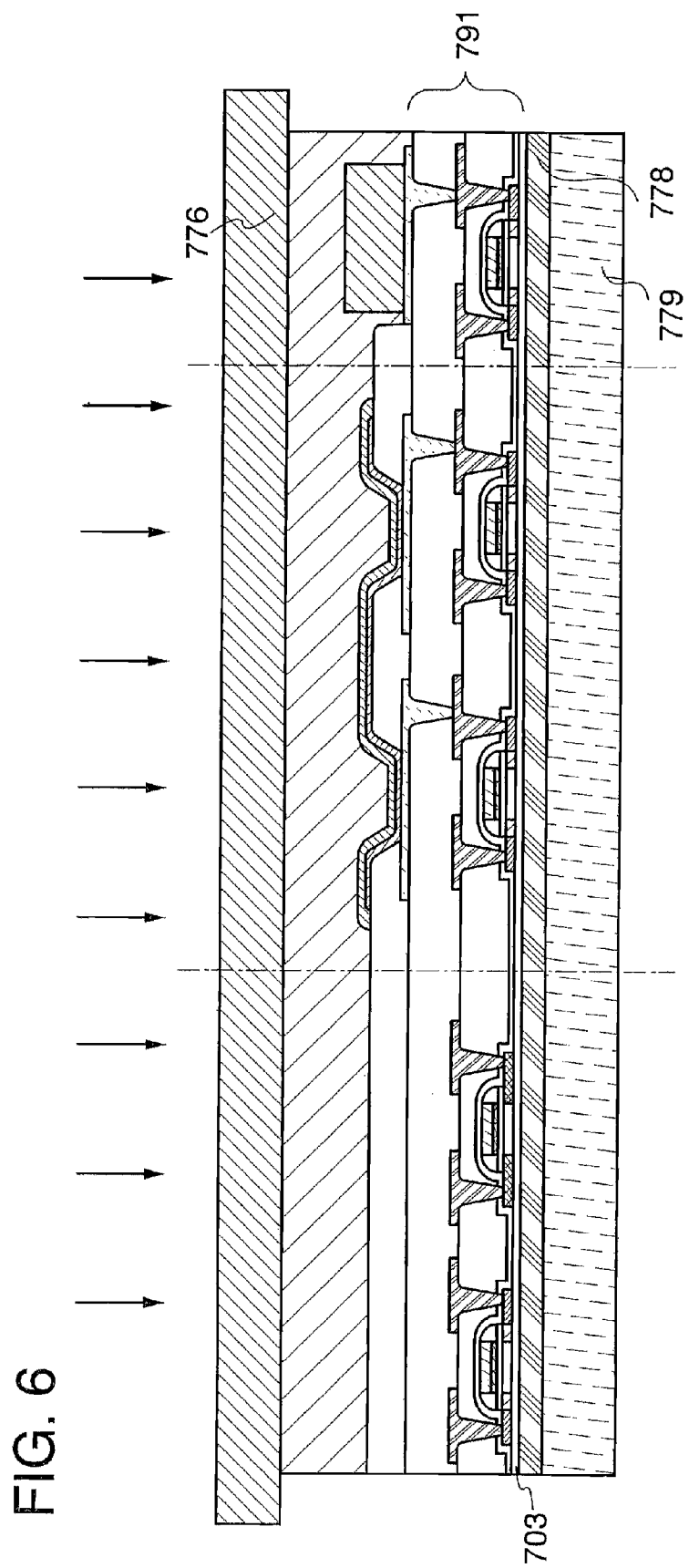
FIG. 6 illustrates a process of manufacturing a semiconductor device according to an aspect of the present invention.

Next, the substrate 778 including the element formation layer 791 and the sheet member 776 are separated from each other. Here, a UV-peeling tape is used as the sheet member 776. First, the sheet member 776 is irradiated with ultraviolet rays to weaken the adhesiveness between the sheet member 776 and the insulating layer 772 (FIG. 6). Then, the sheet member 776 is separated from the insulating layer 772. Then, the support 779 provided for the second substrate 778 is separated from the second substrate 778.

Through the above steps, a semiconductor device shown in FIG. 1B can be manufactured.

The antenna 203 shown in FIGS. 1A and 1B may be provided so as to overlap with the memory section 202 or in the periphery of the memory section 202, not overlapping with it. When the antenna 203 overlaps with the memory section 202, it may overlap with the entire surface or a part thereof.

As a method for wirelessly transmitting signals by the semiconductor device 200, an electromagnetic coupling method, an electromagnetic induction method, a microwave method, or the like can be used. The transmission method may be selected as appropriate in consideration of the purpose by a practitioner, and a suitable antenna may be provided in accordance with the transmission method.

In the case of using an electromagnetic coupling method or an electromagnetic induction method (for example, 13.56 MHz band) utilizing electromagnetic induction caused by the change in magnetic field density, a conductive layer functioning as an antenna is formed in a loop shape (such as a loop antenna) or a spiral shape (such as a spiral antenna).

In the case of using a microwave method (for example, UHF band (860 to 960 MHz band), 2.45 GHz band, or the like), the shape of a conductive layer functioning as an antenna, such as the length, may be as appropriate set in consideration of the wavelength of an electromagnetic wave used for the signal transmission. For example, the conductive layer functioning as an antenna can be formed to have a linear shape (such as a dipole antenna), a flat shape (such as a patch antenna), or a ribbon shape. The shape of the conductive layer functioning as an antenna is not limited to a linear shape but may be a curved shape, a meandering shape, or a combination thereof in consideration of the wavelength of an electromagnetic wave.

A TFT may have a single gate structure in which one channel formation region is formed, a double gate structure in which two channel formation regions are formed, or a triple gate structure in which three channel formation regions are formed. That is, the present invention can be applied to a TFT having a multi gate structure including a plurality of channel formation regions. Further, a thin film transistor in a peripheral driver circuit region may also have a single gate structure or a multi gate structure such as a double gate structure or a triple gate structure.

The present invention is not limited to a method for manufacturing the TFT described in this embodiment mode, but also applied to a method for manufacturing a TFT of a top gate type (planar type), a bottom gate type (reversely staggered type), a dual gate type having two gate electrodes arranged above and below a channel region with gate insulating layers interposed therebetween, or other structures.

A semiconductor device of the present invention has at least one surface covered by a resin. Thus, in the semiconductor device, a storage element portion and an element formation layer below the resin layer can be protected from dusts and the like, and the mechanical strength of the semiconductor device can be kept. Further, in the semiconductor device of the present invention, a resin layer is used as a substrate covering at least one surface, and thus a semiconductor device which is thin and bendable can be provided. In addition, the insulating layer is formed over the conductive layer serving as an antenna such that the value in thickness ratio of the insulating layer in a portion not covering the conductive layer to the conductive layer is at least 1.2, and the value in thickness ratio of the insulating layer formed over the conductive layer to the conductive layer is at least 0.2. Thus, the surface of the insulting layer has a sufficient planarity to reduce damages to an element formation layer in a manufacturing process of a semiconductor device. In addition, a semiconductor device having a mechanical strength enough to protect the storage element portion and the element formation layer can be provided. Further, the semiconductor device of the present invention may be formed such that a conductive layer is not exposed in the side face of the semiconductor device, and an insulating layer covering a TFT and the conductive layer is exposed in the side face of the semiconductor device. Thus, elements such as a TFT or an antenna can be protected from dusts and the like by only the insulating layer covering the conductive layer serving as antenna, and thus, the semiconductor device which does not easily deteriorate can be provided. In addition, in a semiconductor device of the present invention, as a substrate covering an element formation layer side, a substrate having a support in its surface is used in the manufacturing process, and thus, the substrate having a thickness of 2 μm to 20 μm can be easily handled. Therefore, a semiconductor device which is thin and bendable can be easily manufactured.

Embodiment Mode 2

Embodiment Mode 2 will describe a manufacturing process of a semiconductor device which is different from that of Embodiment Mode 1. Specifically, a process is described in which a pn junction of a memory cell and a thin film transistor of a logic portion for controlling the memory cell are formed at the same time.

Figure 7:
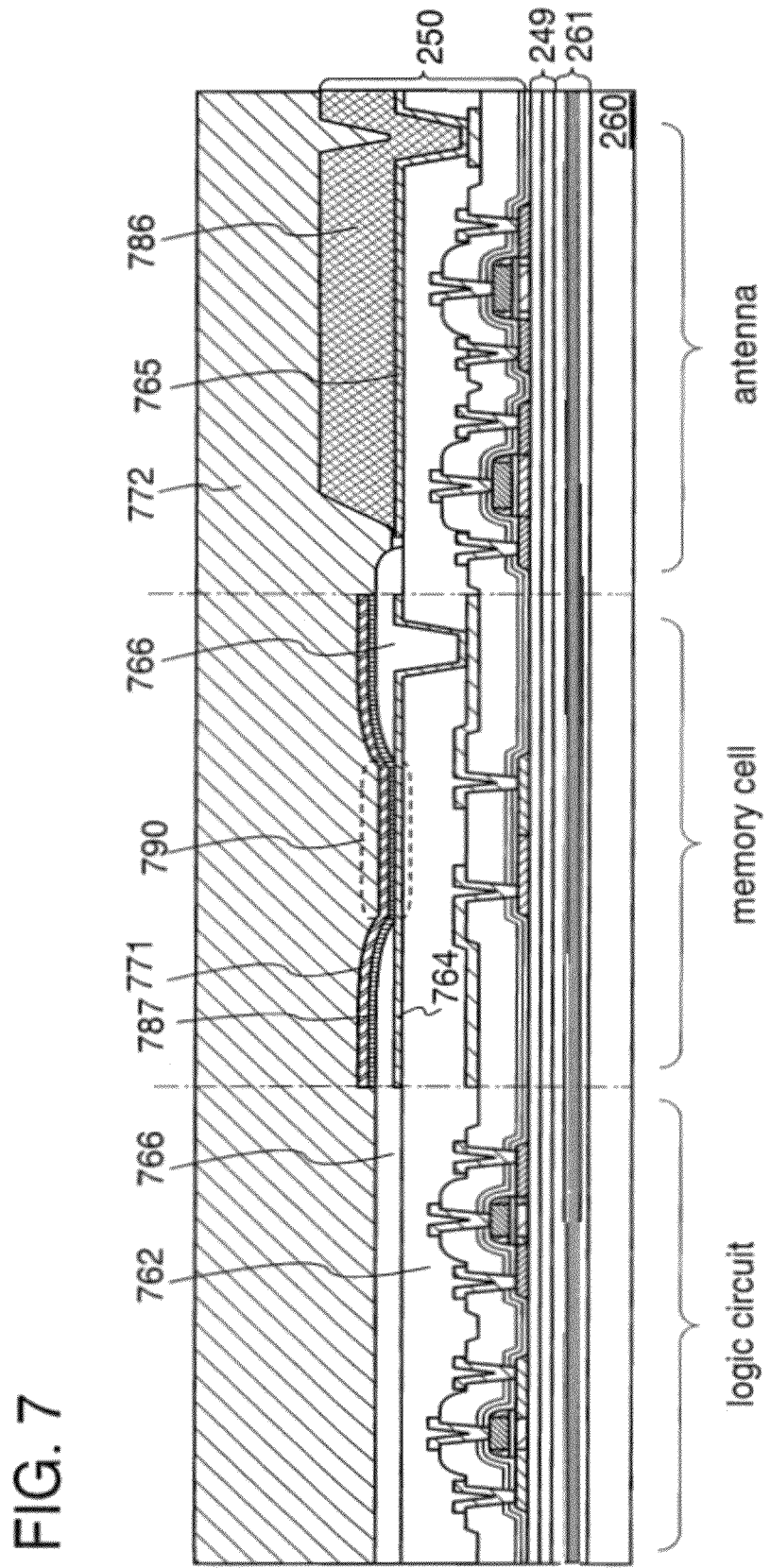
FIG. 7 illustrates a process of manufacturing a semiconductor device according to an aspect of the present invention.
Figure 12:
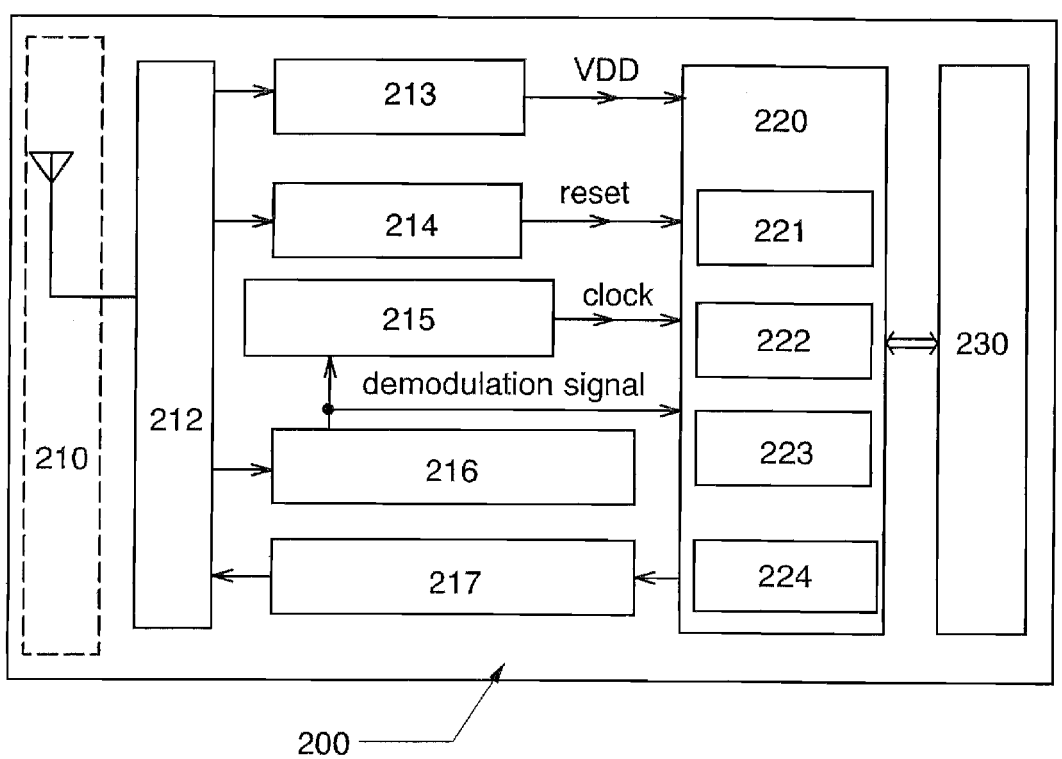
FIG. 12 illustrates a semiconductor device according to an aspect of the present invention.

FIG. 7 shows a schematic cross-sectional structure of a semiconductor device of this embodiment mode. The semiconductor device of this embodiment mode includes an antenna, a memory section, and an integrated circuit portion. The cross section of the memory cell as a part of the memory section is shown in the center of FIG. 7. In the memory cell, a storage element portion is stacked over a diode as a part of the memory section. The left part of the drawing shows a cross section of a p-channel TFT (also referred to as a p-ch TFT) and an n-channel TFT (also referred to as an n-ch TFT) as a part of the cross section of the logic circuit in the memory section. The right part of the drawing shows a cross section of a part of the antenna 210, and further a capacitor of the resonance circuit 212 and an n-channel TFT of a high withstand voltage type of the power source circuit 213 as a part of the cross section of the integrated circuit portion, as shown in FIG. 12. It is needless to say that the integrated circuit portion is also provided with p-channel TFTs and n-channel TFTs similarly to the logic circuit on the left part of the drawing, in addition to the TFT of a high withstand voltage type. Moreover, naturally, the memory section and the integrated circuit portion are provided with a plurality of TFTs and capacitors shown in FIG. 7.

A substrate 260 is a substrate used when an element formation layer 250 is formed. In this embodiment mode, a glass substrate is used as the substrate 260. A peeling layer 261 is formed over the substrate 260, which is used to remove the substrate 260 from the element formation layer 250. The peeling layer 261 is formed over the substrate 260, and a base insulating layer 249 is formed thereover, and then the element formation layer 250 including TFTs or the like is formed over the base insulating layer 249. A method for forming the semiconductor device of this embodiment mode is explained hereinafter with reference to FIG. 7 to FIG. 11.

Figure 8A:
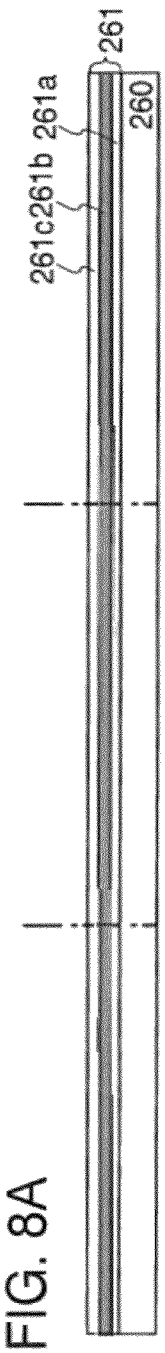
FIGS. 8A to 8E illustrate a process of manufacturing a semiconductor device according to an aspect of the present invention.

The substrate 260 is a glass substrate. As shown in FIG. 8A, the peeling layer 261 including three layers 261a to 261c is formed over the substrate 260. The first layer 261a is formed by a silicon oxynitride film ($SiO_xN_y$, x>y) of 100 nm thick by a parallel plate type plasma CVD apparatus using $SiH_4$ and $N_2O$ as source gases. The second layer 261b is formed by a tungsten film of 30 nm thick using a sputtering apparatus. The third layer 261c is formed by a silicon oxide film of 200 nm thick using a sputtering apparatus.

By the formation of the third layer 261c (silicon oxide), a surface of the second layer 261b (tungsten) is oxidized to form tungsten oxide at the interface. By the tungsten oxide, the substrate 261 can be easily separated when the element formation layer 250 is transferred to another substrate later. The first layer 261a is a layer for increasing the adhesiveness of the second layer 261b during the manufacturing of the element formation layer 250.

The second layer 261b is preferably formed by a metal film including tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or the like or a film of a compound of such metal. The second layer 261b can have a thickness of 20 nm to 40 nm.

Figure 8B:
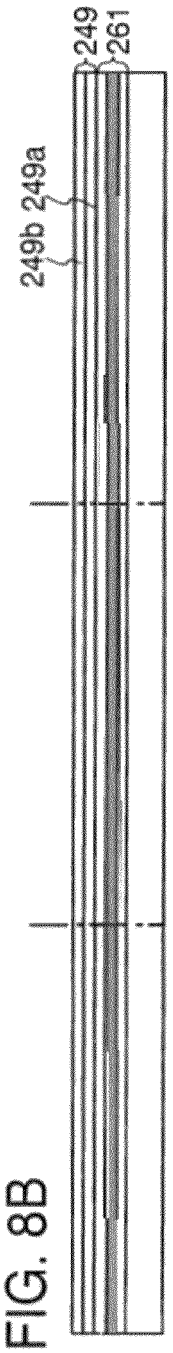

As shown in FIG. 8B, the base insulating layer 249 having a two-layer structure is formed over the peeling layer 261. The first layer 249a is formed of silicon oxynitride ($SiO_xN_y$, x<y) in 50 nm thick by a plasma CVD apparatus using $SiH_4$, $N_2O$, $NH_3$, and $H_2$ as source gases. The barrier property is increased such that the composition ratio of nitrogen of the first layer 249a can be 40% or more. The second layer 249b is formed of silicon oxynitride ($SiO_xN_y$, x>y) having a thickness of 100 nm by a plasma CVD apparatus using $SiH_4$ and $N_2O$ as source gases. The composition ratio of nitrogen of the second layer 249b is 0.5% or less.

Figure 8C:
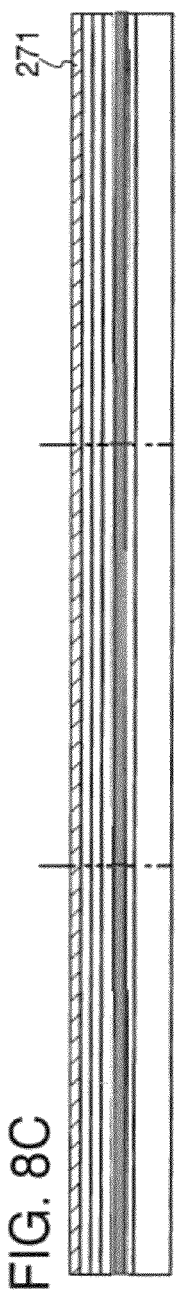

As shown in FIG. 8C, a crystalline silicon film 271 is formed over the base insulating layer 249. The crystalline silicon film 271 is manufactured by the following method. An amorphous silicon film is formed having a thickness of 66 nm by a plasma CVD apparatus using $SiH_4$ and $H_2$ as source gases. The amorphous silicon film is irradiated with laser light so as to be crystallized; thus, the crystalline silicon film 271 is formed. An example of a laser irradiation method is shown. A second harmonic (wavelength: 532 nm) of an LD-pumped $YVO_4$ laser is used for the irradiation. The laser is not especially limited to the second harmonic, but the second harmonic is superior to third or higher harmonics in point of energy efficiency. The laser irradiation is conducted such that the beam on the irradiation surface has a linear shape with a length of about 500 μm and a width of about 20 μm and an intensity of 10 to 20 W by an optical system. The beam is moved relative to the substrate at a speed of 10 to 50 cm/sec.

Figure 8D:
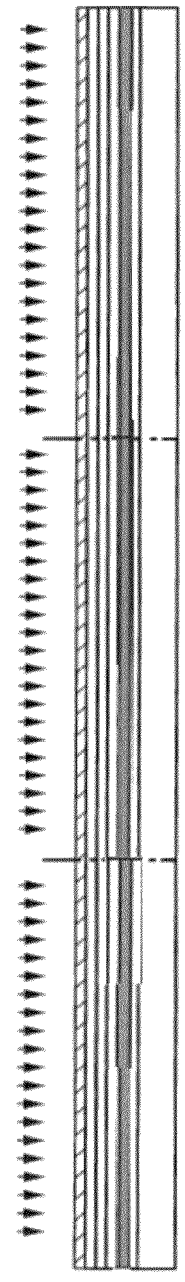

As shown in FIG. 8D, a p-type impurity is added to the crystalline silicon film 271. Here, diborane ($B_2H_6$) diluted with hydrogen is used as a doping gas in an ion doping apparatus, so that boron is entirely added to the crystalline silicon film 271. The crystalline silicon obtained by crystallizing amorphous silicon has a dangling bond; therefore, it is not ideal intrinsic silicon but has a low n-type conductivity. Accordingly, addition of a minute amount of p-type impurities provides an effect of making the amorphous silicon film 271 into intrinsic silicon. The step in FIG. 8D may be conducted as necessary.

Figure 8E:
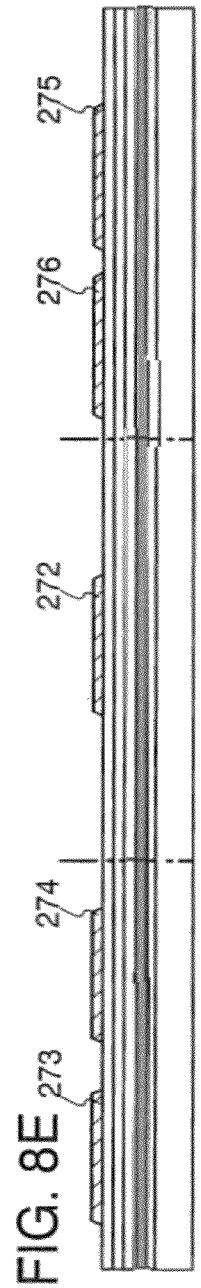

Next, as shown in FIG. 8E, the crystalline silicon film 271 is divided for each element to form semiconductor layers 272 to 276. In the semiconductor layer 272, a diode of the memory cell is formed. By the use of the semiconductor layers 273 to 275, channel formation regions, source regions, and drain regions of TFTs are formed. The semiconductor layer 276 forms an electrode of an MIS capacitor. An example of a method for processing the crystalline silicon film 271 is shown. A resist is formed over the crystalline silicon film 271 by a photolithography process, and the crystalline silicon film 271 is etched by using the resist as a mask and using $SF_6$ and $O_2$ as an etching agent with a dry etching apparatus; thus, the semiconductor layers 272 to 276 having desired shapes are formed.

As shown in FIG. 9A, a resist R31 is formed by a photolithography process and a minute amount of p-type impurities is added to the semiconductor layers 274 and 275 of the n-channel TFTs. Here, diborane ($B_2H_6$) diluted with hydrogen is used as a doping gas so that the semiconductor layers 274 and 275 are doped with boron by an ion doping apparatus. The resist R31 is removed after the completion of the doping.

The step in FIG. 9A is performed to prevent the threshold voltage of the n-channel TFT from becoming negative. Boron may be added to the semiconductor layers 274 and 275 of the n-channel TFTs at a concentration of $5\times10^{15}$ atoms/cm$^3$ to $1\times10^{17}$ atoms/cm$^3$. The step in FIG. 9A may be conducted as necessary. Moreover, the p-type impurity may be added to the semiconductor layer 272 of the memory cell.

As shown in FIG. 9B, an insulating layer 277 is formed over the entire surface of the substrate 260. The insulating layer 277 functions as a gate insulating layer for the TFTs and a dielectric for the capacitor. Here, the insulating layer 277 is formed of a silicon oxynitride film ($SiO_xN_y$, x>y) having a thickness of about 20 nm to 40 nm by a plasma CVD apparatus using $SiH_4$ and $N_2O$ as source gases.

As shown in FIG. 9C, a resist R32 is formed by a photolithography process, and an n-type impurity is added to the semiconductor layer 272 of the memory cell and the semiconductor layer 276 of the capacitor. By this step, the concentration of the n-type impurity in each of the n-type impurity region of the semiconductor layer 272 and the n-type impurity region functioning as one electrode of the capacitor is determined. Phosphine ($PH_3$) diluted with hydrogen is used as a doping gas, so that the semiconductor layers 272 and 276 are doped with phosphorus by using an ion doping apparatus. Thus, the entire semiconductor layer 272 becomes an n-type impurity region 278 and the entire semiconductor layer 276 becomes an n-type impurity region 279. The resist R32 is removed after the completion of the doping step.

As shown in FIG. 9D, a conductive layer 281 is formed over the insulating layer 277. The conductive layer 281 forms a gate electrode of the TFT, or the like. Here, the conductive layer 281 has a two-layer structure. The first layer is formed of tantalum nitride (TaN) with a thickness of 30 nm and the second layer is formed of tungsten (W) with a thickness of 370 nm. The tantalum nitride and the tungsten are formed by a sputtering apparatus.

A resist is formed over the conductive layer 281 by a photolithography process, and the conductive layer 281 is etched by an etching apparatus. Thus, first conductive layers 283 to 286 are formed over the semiconductor layers 273 to 275 and 279 as shown in FIG. 10A. The first conductive layers 283 to 286 serve as gate electrodes or gate wires of the TFTs. In the n-channel TFT of a high withstand voltage type, the conductive layer 285 is formed so that the gate width (channel length) is larger than that in the other TFTs. The first conductive layer 286 forms one electrode of the capacitor.

The conductive layer 281 is etched by a dry etching method. As an etching apparatus, an ICP (Inductively Coupled Plasma) etching apparatus is used. As an etching agent, a mixed gas of $Cl_2$, $SF_6$, and $O_2$ is used first in order to etch the tungsten, and then the etching agent to be introduced in a process chamber is changed to only a $Cl_2$ gas to etch the tantalum nitride.

As shown in FIG. 10B, a resist R33 is formed by a photolithography process. An n-type impurity is added to the semiconductor layers 274 and 275 of the n-channel TFT. N-type low-concentration impurity regions 288 and 289 are formed in a self-aligning manner in the semiconductor layer 274 by using the first conductive layer 284 as a mask, and n-type low-concentration impurity regions 290 and 291 are formed in a self-aligning manner in the semiconductor layer 275 by using the first conductive layer 285 as a mask. In this embodiment mode, phosphine ($PH_3$) diluted with hydrogen is used as a doping gas, and phosphorus is added to the semiconductor layers 274 and 275 by an ion doping apparatus. The step of FIG. 10B is a step of forming an LDD region in the n-channel TFT. The n-type impurity is included in the n-type low-concentration impurity regions 288 and 289 at a concentration of $1\times10^{16}$ atoms/cm$^3$ to $5\times10^{18}$ atoms/cm$^3$.

As shown in FIG. 10C, a resist R34 is formed by a photolithography process. A p-type impurity is added to the semiconductor layer 278 of the memory cell and the semiconductor layer 273 of the p-channel TFT. Since a part of the semiconductor layer 278 which is left as an n-type impurity region 278$n$ is covered with the resist R34, an exposed region 278$p$ becomes a p-type impurity region. By this impurity addition step, the n-type impurity region 278$n$ and the p-type impurity region 278$p$ forming a pn junction are formed in the semiconductor layer 278. Since the semiconductor layer 278 is formed in advance as the n-type impurity region, the p-type impurity is added at higher concentration than the n-type impurity added in advance so that the region 278$p$ can have p-type conductivity.

P-type high-concentration impurity regions 273$a$ and 273$b$ are formed in a self-aligning manner in the semiconductor layer 273 by using the first conductive layer 283 as a mask. A region 273$c$ covered with the first conductive layer 283 is formed in a self-aligning manner as the channel formation region.

The p-type impurity regions are formed by doping the semiconductor layers 274 and 275 with boron by an ion doping apparatus using diborane ($B_2H_6$) diluted with hydrogen as a doping gas. The resist R34 is removed after the completion of the doping.

As shown in FIG. 10D, insulating layers 293 to 296 are formed in the peripheries of the first conductive layers 283 to 286. The insulating layers 293 to 296 are called sidewalls or side walls. First, a silicon oxynitride film ($SiO_xN_y$, x>y) is formed to be 100 nm thick by a plasma CVD apparatus using $SiH_4$ and $N_2O$ as source gases. Subsequently, a silicon oxide film is formed to be 200 nm thick by an LPCVD apparatus using $SiH_4$ and $N_2O$ as source gases. A resist is formed by a photolithography process. By using this resist, the silicon oxide layer in the upper layer is subjected to wet-etching by buffered hydrochloric acid, then the resist is remove, and the silicon nitride oxide film in the lower layer is subjected to dry etching, thereby forming the insulating layers 293 to 296. In accordance with a sequence of these steps, the insulating layer 277 formed of silicon oxynitride is also etched and the insulating layer 277 is left only under the first conductive layers 283 to 286 and the insulating layers 293 to 296.

As shown in FIG. 11A, a resist R35 is formed by a photolithography process. An n-type impurity is added to the semiconductor layers 274 and 275 of the n-channel TFTs and the semiconductor layer of the capacitor, thereby forming n-type high-concentration impurity regions. In the semiconductor layer 274, the n-type impurity is further added to the n-type low-concentration impurity regions 288 and 289 (see FIG. 10B) by using the first conductive layer 284 and the insulating layer 294 as masks, thereby forming n-type high-concentration impurity regions 274a and 274b in a self-aligning manner. A region 274c overlapping with the first conductive layer 284 becomes a channel formation region in a self-aligning manner. In addition, regions 274e, 274d of the n-type low-concentration impurity regions 288 and 289 that overlap with the insulating layer 294 are left as n-type low-concentration impurity regions.

Similarly to the semiconductor layer 274, n-type high-concentration impurity regions 275a and 275b, a channel formation region 275c, and n-type low-concentration impurity regions 275e and 275d are formed in the semiconductor layer 275.

At this time, the entire semiconductor layer 279 becomes the n-type impurity region (see FIG. 9C). An n-type impurity is further added to the n-type impurity region 279 by using the first conductive layer 286 and the insulating layer 296 as masks, thereby forming n-type high-concentration impurity regions 279a and 279b in a self-aligning manner. A region of the semiconductor layer 279 that overlaps with the first conductive layer 286 and the insulating layer 296 is an n-type impurity region 279c.

In the step of adding the n-type impurity, as aforementioned, an ion doping apparatus may be used and phosphine ($PH_3$) diluted with hydrogen may be used as a doping gas. The n-type high-concentration impurity regions 274a, 274b, 275a, and 275b of the n-channel TFTs are doped with phosphorus so that the concentration of phosphorus ranges from $1×10^{20}$ atoms/$cm^3$ to $2×10^{21}$ atoms/$cm^3$.

As mentioned above, in this embodiment mode, the n-type impurity region 278n and the p-type impurity region 278p of the memory cell are formed in accordance with a sequence of steps of adding impurities to the semiconductor layers for the thin film transistors and the capacitor. In this embodiment mode, the concentration of the n-type impurity and the p-type impurity is the same in the n-type impurity region 278n and the n-type high-concentration impurity region 279c of the capacitor. Thus, their sheet resistances are the same. The p-type impurity region 278p has the same concentration of the p-type impurity as the p-type high-concentration impurity regions 273a and 273b of the p-channel thin film transistor; however, the p-type impurity region 278p has higher concentration of the n-type impurity than the p-type high-concentration impurity regions 273a and 273b. Moreover, the p-type impurity region 278p has the same concentration of the n-type impurity as the n-type impurity region 279c of the capacitor.

The resist R35 is removed to form a cap insulating layer 298 as shown in FIG. 11B. The cap insulating layer 298 is formed by a silicon oxynitride film ($SiO_xN_y$, x>y) in 50 nm thick by a plasma CVD apparatus. $SiH_4$ and $N_2O$ are used as source gases to form the silicon oxynitride film. After forming the cap insulating layer 298, a heat treatment is performed in a nitrogenous atmosphere of 550° C. to activate the n-type impurity and the p-type impurity added to the semiconductor layers 273 to 275 and 278 to 279.

As shown in FIG. 11C, first interlayer insulating layers 299 and 300 are formed. The first interlayer insulating layer 299 as a first layer is formed of silicon oxynitride ($SiO_xN_y$, x<y) having a thickness of 100 nm by a plasma CVD apparatus using $SiH_4$ and $N_2O$ as source gases. The first interlayer insulating layer 300 as a second layer is formed of silicon oxynitride ($SiO_xN_y$, x>y) having a thickness of 600 nm by using $SiH_4$, $N_2O$, $NH_3$, and $H_2$ as source gases by a plasma CVD apparatus.

The first interlayer insulating layer 299 and 300 and the cap insulating layer 298 are removed by a photolithography process and a dry etching process, thereby forming contact holes. A conductive layer is formed over the first interlayer insulating layer 300. Here, the conductive layer has a four-layer structure in which Ti of 60 nm thick, TiN of 40 nm thick, pure aluminum of 500 nm thick, and Ti of 100 nm thick are stacked in order from the bottom. These layers are formed by a sputtering apparatus. The conductive layer is processed into a predetermined shape by a photolithography process and a dry etching process, thereby forming second conductive layers 301 to 315.

Although the second conductive layers and the first conductive layer are connected to each other over the semiconductor layer in the drawing in order to explain the connection between the second conductive layers and the first conductive layer. Actually, the second conductive layers and the first conductive layer may be formed so that the contact portion therebetween does not overlap with the semiconductor layer.

The second conductive layer 301 of the memory cell forms a word line. The second conductive layer 302 forms an electrode for connecting the diode with the storage element and is divided for each memory cell. The n-type high-concentration impurity regions 279a and 279b are connected to each other by the second conductive layer 312. Accordingly, an MIS capacitor of a stacked-layer structure including the n-type impurity region 279c, the insulating layer 277, and the first conductive layer 286 is formed. The second conductive layer 314 forms a terminal of the integrated circuit portion, to which the antenna 210 is connected.

Then, through the steps similar to those in Embodiment Mode 1, the semiconductor device as shown in FIG. 7 can be provided. In other words, an insulating layer 762 is formed over the second conductive layers 301 to 315, conductive layers 764, 765 are formed over the insulating layer 762 and in contact holes, an insulating layer 766 is formed over the conductive layers 764, 765, an organic compound-containing layer 787 is formed to partially cover the insulating layer 766 and the conductive layer 764, a conductive layer 771 is formed over the organic compound-containing layer 787, a conductive layer 786 serving as an antenna is formed over the conductive layer 765, and an insulating layer 772 is formed over the conductive layers 771 and 786.

Although the semiconductor layer 276 of the capacitor has the n-type impurity region, it may also have a p-type impurity region. In the latter case, a p-type impurity is added in the step of FIG. 9C. In the step of FIG. 9C, the entire semiconductor layer 278 of the memory cell becomes a p-type impurity region. Therefore, in the step of FIG. 10C, the p-type impurity is not added to the semiconductor layer 278. Then, the n-type impurity is added to a predetermined region of the semiconductor layer 278 in the step of FIG. 11A.

A semiconductor device of the present invention has at least one surface covered by a resin. Thus, in the semiconductor device, a storage element portion and an element formation layer below the resin layer can be protected from dusts and the like, and the mechanical strength of the semiconductor device can be kept. Further, in the semiconductor device of the present invention, a resin layer is used as a substrate covering at least one surface, and thus a semiconductor device which is thin and bendable can be provided. In addition, the insulating layer is formed over the conductive layer serving as an antenna such that the value in thickness ratio of the insulating layer in a portion not covering the conductive layer to the conductive layer is at least 1.2, and the value in thickness ratio of the insulating layer formed over the conductive layer to the conductive layer is at least 0.2. Thus, the surface of the insulting layer has a sufficient planarity to reduce damages to an element formation layer in a manufacturing process of a semiconductor device. In addition, a semiconductor device having a mechanical strength enough to protect the storage element portion and the element formation layer can be provided. Further, the semiconductor device of the present invention may be formed such that a conductive layer is not exposed in the side face of the semiconductor device, and an insulating layer covering a TFT and the conductive layer is exposed in the side face of the semiconductor device. Thus, elements such as a TFT or an antenna can be protected from dusts and the like by only the insulating layer covering the conductive layer serving as antenna, and thus, the semiconductor device which does not easily deteriorate can be provided. In addition, in a semiconductor device of the present invention, as a substrate covering an element formation layer side, a substrate having a support in its surface is used in the manufacturing process, and thus, the substrate having a thickness of 2 μm to 20 μm can be easily handled. Therefore, a semiconductor device which is thin and bendable can be easily manufactured.

Moreover, the semiconductor device of this embodiment mode has a pn junction in the memory cell, and thus, can write data in the storage element portion using an organic material, at any time including the manufacturing time. Therefore, the semiconductor device shown in this embodiment mode is applied to high value-added semiconductor devices such as wireless chips, which leads to cost reduction.

The pn junction in the memory cell shown in this embodiment mode can be formed at the same time as thin film transistors of a logic circuit controlling the memory cell, as well as can be formed without special steps added to the manufacturing process of the thin film transistors. Therefore, conventional resources and facilities for forming thin film transistors can be used as they are, and the present invention is industrially very effective.

Embodiment Mode 3

Embodiment Mode 3 will explain an example of applying a semiconductor device of the present invention to a semiconductor device capable of inputting and outputting data without contact with reference to drawings. The semiconductor device capable of inputting and outputting data without contact is also referred to as an RFID (Radio Frequency Identification) tag, an ID tag, an IC tag, an IC chip, an RF tag, a wireless tag, an electronic tag, or a wireless chip.

FIG. 12 is a block diagram showing a structure example of a semiconductor device 200 of this embodiment mode. The semiconductor device 200 has an antenna 210 to exchange data without contact (wirelessly). The semiconductor device 200 further includes a resonance circuit 212, a power source circuit 213, a reset circuit 214, a clock generating circuit 215, a data demodulating circuit 216, a data modulating circuit 217, a control circuit 220 for controlling another circuit, and a memory section 230, as signal processing circuits which process signals received with the antenna and supply signals for transmission to the antenna.

The resonance circuit 212 is a circuit in which a capacitor and a coil are connected to each other in parallel, and which receives a signal with the antenna 210 and outputs from the antenna 210 a signal received from the data modulating circuit 217. The power source circuit 213 is a circuit for generating a power source potential based on a received signal. The reset circuit 214 is a circuit for generating a reset signal. The clock generating circuit 215 is a circuit for generating various clock signals based on a received signal inputted through the antenna 210. The data demodulating circuit 216 is a circuit for demodulating a received signal and outputting the demodulated signal to the control circuit 220. The data modulating circuit 217 is a circuit for modulating a signal received from the control circuit 220.

Figure 13A:
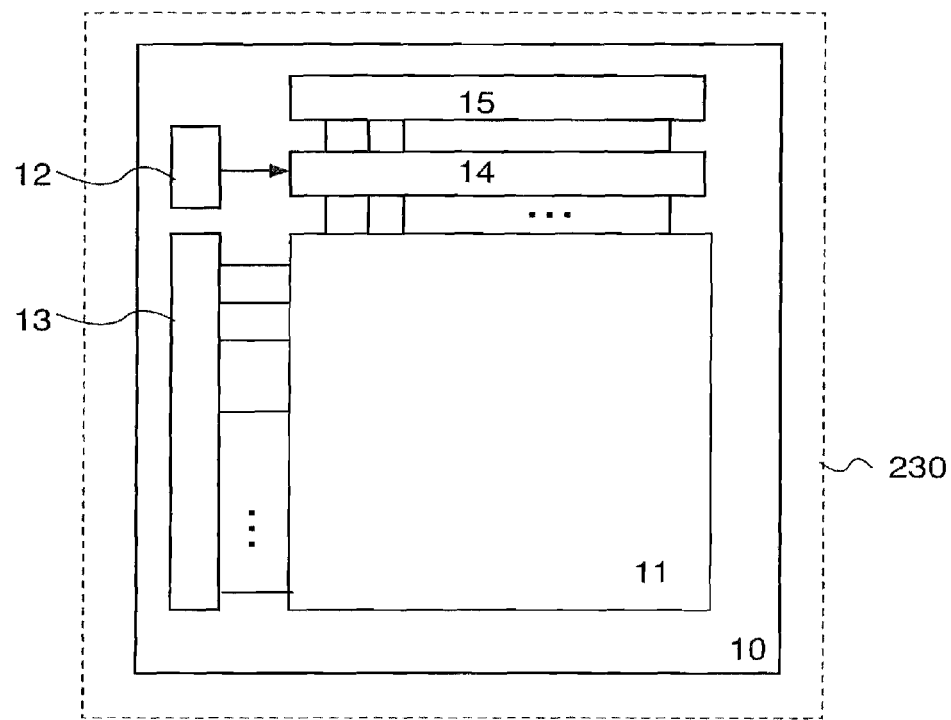
FIGS. 13A and 13B illustrate a semiconductor device according to an aspect of the present invention.

The memory section 230 can have, for example, a structure example shown in FIG. 13A. The memory section 230 shown in this embodiment mode includes the following over a substrate 10: a memory cell array 11 having memory cells arranged in matrix; decoders 12, 13, a selector 14, a read-write circuit 15, and the like. The memory cell array 11 has memory cells of n rows×m columns. The decoder 13 is connected to the memory cell array 11 by n number of word lines Wh (h=1, 2, ... n), and the selector 14 is connected to the memory cell array 11 by m number of bit lines Bk (k=1, 2, ... m). The structure of the memory section shown in FIG. 13A is only an example, and the memory section may further include another circuit such as a sense amplifier, an output circuit, or a buffer over the substrate 10.

Figure 13B:
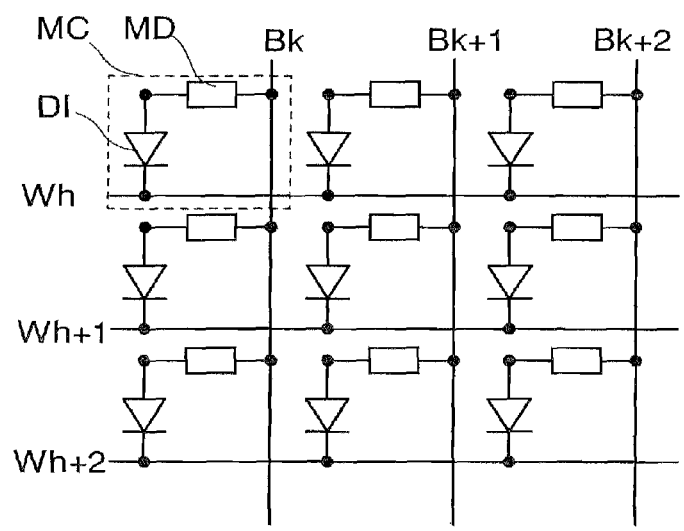

FIG. 13B shows an example of an equivalent circuit diagram of a memory cell MC provided in the memory cell array 11. FIG. 13B shows memory cells MCs of 3 rows×3 columns. In this embodiment mode, each memory cell MC includes a storage element portion MD and a diode D1 connected serially to the storage element portion MD. The storage element portion MD is connected to the bit line Bk and the diode D1 is connected to the word line Wh. The diode D1 can be connected in the opposite direction, in other words, the diode D1 can be connected to the storage element portion MD by a terminal opposite to the terminal shown in FIG. 13B. The relation between the bit line B and the word line W may be opposite. Note that the structure of the memory section 230 is not limited to the structures shown in FIGS. 13A and 13B.

As the control circuit 220, for example, a code extracting circuit 221, a code judging circuit 222, a CRC judging circuit 223, and an output unit circuit 224 are provided. The code extracting circuit 221 is a circuit for extracting each of a plurality of codes included in an instruction transmitted to the control circuit 220. The code judging circuit 222 is a circuit for judging the content of the instruction by comparing the extracted code and a code corresponding to a reference. The CRC judging circuit 223 is a circuit for detecting whether there is a transmission error or the like based on the judged code.

Next, an example of an operation of the semiconductor device 200 is explained. After receiving a wireless signal with the antenna 210, the wireless signal is transmitted to the power source circuit 213 via the resonance circuit 212, thereby generating a high power source potential (hereinafter referred to as a VDD). The VDD is supplied to the circuits in the semiconductor device 200. The signal transmitted to the data demodulating circuit 216 via the resonance circuit 212 is demodulated (hereinafter referred to as a demodulation signal). Moreover, the signals passed through the reset circuit 214 and the clock generating circuit 215 via the resonance circuit 212 and the demodulation signal are transmitted to the control circuit 220. The signals transmitted to the control circuit 220 are analyzed by the code extracting circuit 221, the code judging circuit 222, the CRC judging circuit 223, and the like. The information of the semiconductor device stored in the memory section 230 is outputted in accordance with the analyzed signals. The outputted information of the semiconductor device is encoded through the output unit circuit 224. The encoded information of the semiconductor device 200 is transmitted as a wireless signal by the antenna 210 through the data modulating circuit 217. In the plural circuits of the semiconductor device 200, a low power source potential (hereinafter referred to as VSS) is common, and the VSS can be GND.

Thus, the data of the semiconductor device can be read by transmitting a signal from a reader/writer to the semiconductor device 200 and receiving the signal transmitted from the semiconductor device 200 by the reader/writer.

The semiconductor device 200 can supply a power source voltage to each circuit by an electromagnetic wave without mounting a power source (battery). Alternatively, the semiconductor device 200 can have a power source (battery) mounted to supply a power source voltage to each circuit by an electromagnetic wave and the power source (battery).

Figure 14A:
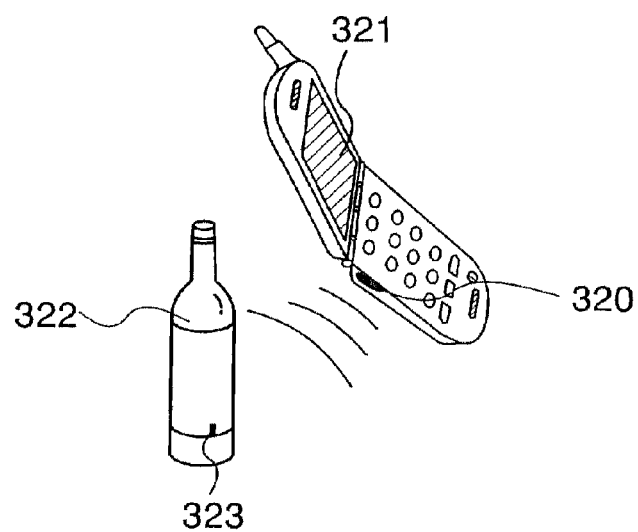
FIGS. 14A and 14B illustrate application modes of a semiconductor device according to an aspect of the present invention.
Figure 14B:
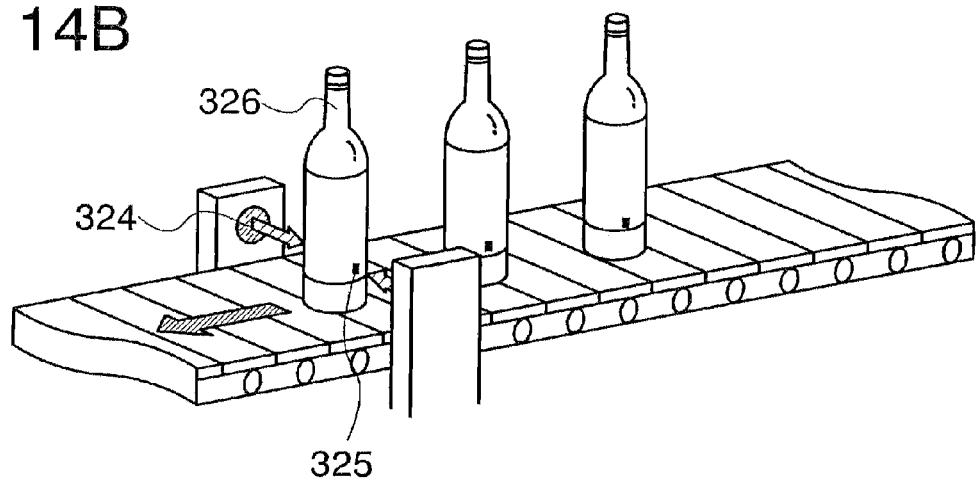

Subsequently, an example of an application of a semiconductor device which can input and output data without contact (or wirelessly) is explained with reference to FIGS. 14A and 14B. A side face of a portable terminal including a display portion 321 is provided with a reader/writer 320, and a side face of a product 322 is provided with an RFID tag 323 (FIG. 14A). When the reader/writer 3200 is held over the RFID tag 323 included in the product 322, information on the product 322 such as a raw material, the place of origin, an inspection result in each production process, the history of distribution, or an explanation of the article is displayed on the display portion 321. Further, when a product 326 is transported by a conveyor belt, the product 326 can be inspected using a reader/writer 324 and an RFID tag 325 provided over the product 326 (FIG. 14B). Thus, by utilizing such an RFID tag for a system, information can be acquired easily, and improvement in functionality and added value of the system can be achieved.

The semiconductor device shown in the embodiment mode is used for a semiconductor device which can wirelessly input and output data, which leads to easy manufacturing of such a semiconductor device which is thinner and can wirelessly input and output data.

Embodiment Mode 4

A semiconductor device of the present invention can be used being provided in, for example, paper money, coins, securities, certificates, bearer bonds, packing containers, books, recording media, personal items, vehicles, food items, clothes, healthcare items, livingwares, medicals, electronic devices, or the like. Examples thereof will be described with reference to FIGS. 15A to 16D.

Figure 15A:
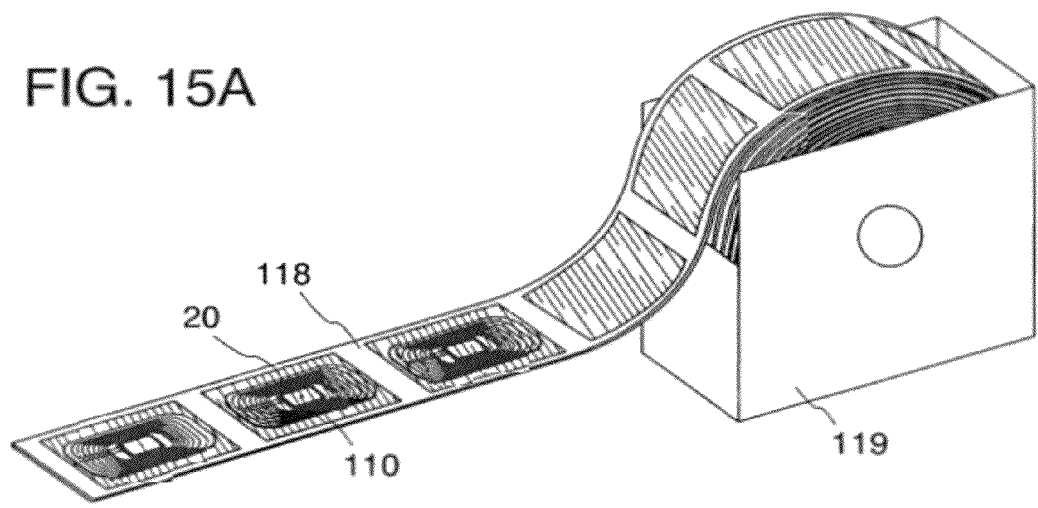
FIGS. 15A to 15E illustrate application modes of a semiconductor device according to an aspect of the present invention.

FIG. 15A shows an example of a state of completed products of ID labels according to the present invention. On a label board (separate paper) 118, a plurality of ID labels 20 each incorporating an IC chip 110 are formed. The ID labels 20 are put in a box 119. In addition, on the ID label, information on a commercial product or service (for example, a name of the product, a brand, a trademark, a trademark owner, a seller, a manufacturer, and the like) is written, while an ID number that is unique to the commercial product (or the kind of the commercial product) is assigned to the incorporated IC chip to make it possible to easily figure out forgery, infringement of intellectual property rights such as a patent and a trademark, and illegality such as unfair competition. In addition, a lot of information that is too much to write clearly on a container of the commercial product or the label, for example, the production area, selling area, quality, raw material, efficacy, use, quantity, shape, price, production method, directions for use, time of the production, time of the use, expiration date, instructions of the commercial product, information on the intellectual property of the commercial product and the like can be input in the IC chip so that a transactor and a consumer can access the information by using a simple reader. While the producer can also easily rewrite or delete the information, a transactor or consumer is not allowed to rewrite or delete the information.

Figure 15B:
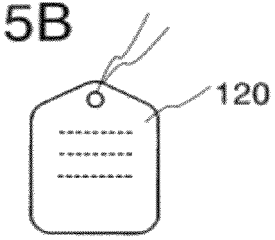

FIG. 15B shows an ID tag 120, which has an IC chip incorporated. By mounting the ID tag on commercial products, the management of the commercial products becomes easier. For example, in the case where the commercial product is stolen, the thief can be figured out quickly by tracing the pathway of the commercial product. In this way, by providing the ID tag, commercial products that are superior in so-called traceability can be distributed.

Figure 15C:
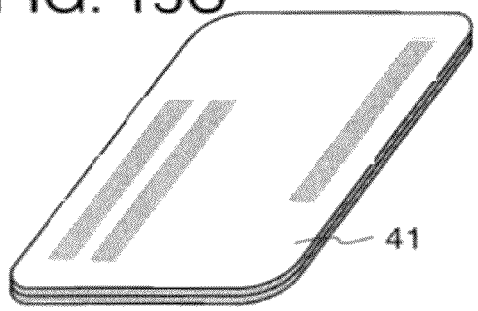

FIG. 15C shows an example of a state of a completed product of an ID card 41 according to the present invention. The ID card includes all kinds of cards such as a cash card, a credit card, a prepaid card, an electronic ticket, electronic money, a telephone card, and a membership card.

Figure 15D:
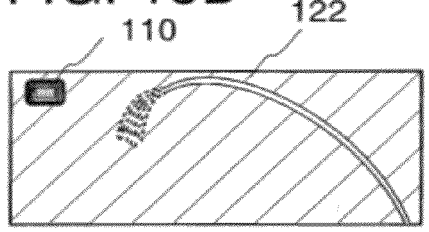

FIG. 15D shows an example of a state of a completed product of a bearer bond 122 according to the present invention. The bearer bonds include, but not limited to of course, stamps, tickets, admission tickets, merchandise coupons, book coupons, stationery coupons, beer coupons, rice coupons, various gift coupons, various service coupons. In addition, a semiconductor device of the present invention can be provided in securities such as a check, a certificate and a promissory note, certificates such as a driving license and a resident card, or the like, not limited to bearer bonds.

Figure 15E:
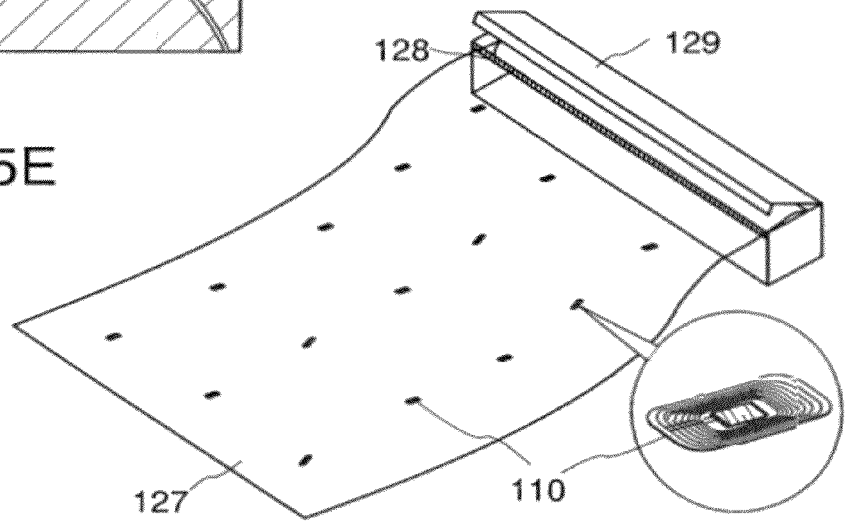

FIG. 15E shows a wrapping film 127 incorporating an IC chip 110, for wrapping a commercial product. The wrapping film 127 can be manufactured, for example, by scattering IC chips arbitrarily on a lower film and covering them with an upper film. The wrapping film 127 is put in a box 129, and a desired amount of film can be cut away with a cutter 128 and used. The material of the wrapping film 127 is not particularly limited. For example, materials such as a thin film resin, an aluminum foil, and paper can be used.

Figure 16A:
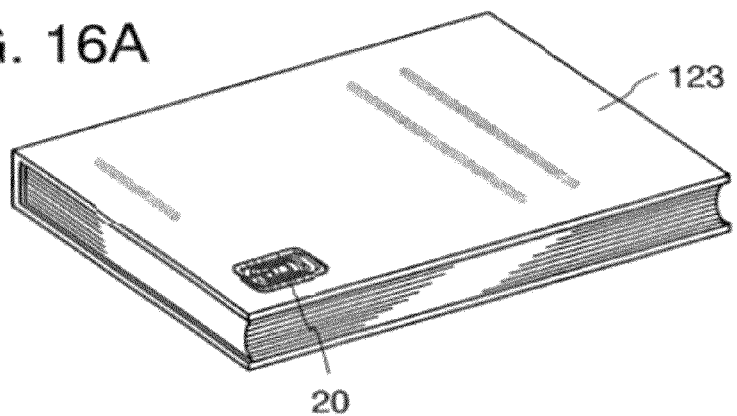
FIGS. 16A to 16D illustrate application modes of a semiconductor device according to an aspect of the present invention.
Figure 16B:
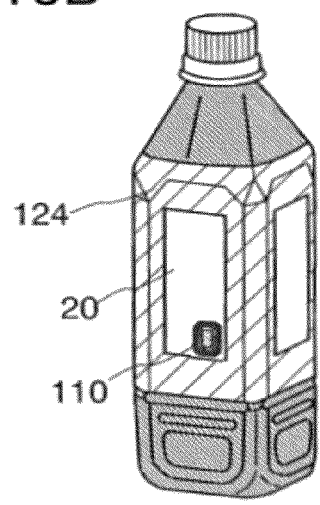

FIGS. 16A and 16B respectively show a book 123 and a plastic bottle 124 to which an ID label 20 according to the present invention is attached. It is to be noted that the goods are not limited to these and the ID label may be attached to various goods such as: containers for packages such as paper for packing a box lunch; recording media such as DVD software and a video tape; vehicles including a wheeled vehicle such as a bicycle and a vessel; personal belongings such as a bag and glasses; foods such as food items and beverages; clothes such as clothing and footwear; healthcare items such as a medical device and a health appliance; livingware such as furniture and a lighting apparatus; medicals such as a medicine and an agricultural chemical; electronic devices such as a liquid crystal display device, an EL display device, a television set (a television receiver, a thin television receiver), and a mobile phone. The IC chip that is used in the present invention is quite thin, therefore, when the thin film integrated circuit is mounted on goods such as the book, the function or design is not damaged. Furthermore, in the case of a non-contact type thin film integrated circuit device, an antenna and a chip can be integrated to make it easier to transfer the non-contact type thin film integrated circuit device directly to a commercial product with a curved surface.

Figure 16C:
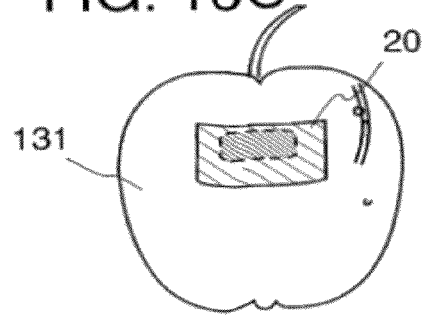
Figure 16D:
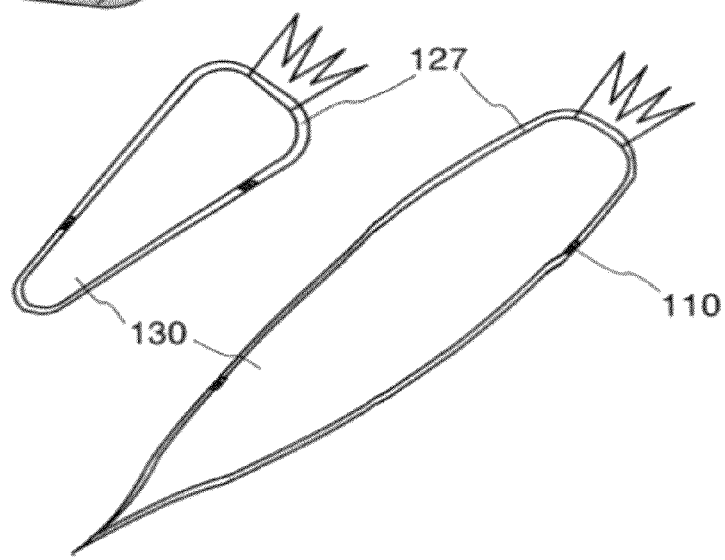

FIG. 16C shows a state in which the ID label 20 is directly attached to fresh food such as fruits 131. In addition, FIG. 16D shows an example in which fresh food such as vegetables 130 is wrapped in the wrapping films. When an ID label is attached to a commercial product, probably, the ID label is peeled off. However, when the commercial product is wrapped in wrapping films, it is difficult to peel off the wrapping film, which brings some merit for security.

When an RFID is incorporated in bills, coins, securities, certificates, bearer bonds, and the like, forgery of them can be prevented. When an RFID is equipped in containers for packages, books, recording media, personal belongings, foods, livingware, electronic devices, and the like, inspection systems, rental systems and the like can be performed more efficiently. When an RFID is equipped in vehicles, healthcare items, medicals, and the like, forgery and theft of them can be prevented and medicines can be prevented from being taken in the wrong manner. An RFID may be attached to the surface of a product or embedded into a product. For example, an RFID may be embedded in the paper of a book, or an organic resin of a package.

In this manner, when the RFID is equipped in containers for packages, recording media, personal belongings, foods, clothes, livingware, electronic devices, and the like, inspection system, rental system and the like can be performed more efficiently. The RFID also prevents vehicles from being forged or stolen. In addition, when the RFID is implanted into creatures such as animals, each creature can be identified easily. For example, when the RFID is implanted in creatures such as domestic animals, the year of birth, sex, breed and the like can be easily identified.

As described above, the semiconductor device of the present invention can be used for any product. Since the semiconductor device of the present invention is thinner and more bendable, a user can use naturally a product with the semiconductor device attached. Note that this embodiment mode can be freely combined with the other embodiment modes and embodiments.

This application is based on Japanese Patent Application serial no. 2006-175611 filed in Japan Patent Office on Jun. 26, 2006 the entire contents of which are hereby incorporated by reference.

What is claimed is:

1. A semiconductor device comprising:
an element formation layer formed over a substrate;
a storage element portion formed over the element formation layer;
an antenna formed over the element formation layer; and
a resin layer formed over the element formation layer, the storage element portion and the antenna,
wherein the element formation layer comprises a plurality of circuits, the plurality of circuits comprising a battery,
wherein an electromagnetic wave supplies a power source voltage to each of the plurality of circuits, and
wherein a value in a thickness ratio of the resin layer formed on the antenna to the antenna is at least 0.2.

2. The semiconductor device according to claim 1, wherein the resin layer comprises epoxy resin.

3. The semiconductor device according to claim 1, wherein the substrate has a thickness of 2 μm to 20 μm.

4. The semiconductor device according to claim 1, wherein an adhesive layer is provided between the substrate and the element formation layer.

5. A semiconductor device comprising:
an element formation layer formed over a substrate;
a storage element portion formed over the element formation layer;
an antenna formed over the element formation layer; and
a protective film formed over the element formation layer, the storage element portion and the antenna,
wherein the element formation layer comprises a plurality of circuits, the plurality of circuits comprising a battery,
wherein an electromagnetic wave supplies a power source voltage to each of the plurality of circuits, and
wherein a value in a thickness ratio of the protective film formed on the antenna to the antenna is at least 0.2.

6. The semiconductor device according to claim 5, wherein the protective film comprises epoxy resin.

7. The semiconductor device according to claim 5, wherein the substrate has a thickness of 2 μm to 20 μm.

8. The semiconductor device according to claim 5, wherein an adhesive layer is provided between the substrate and the element formation layer.

9. A semiconductor device comprising:
an element formation layer formed over a substrate;
a storage element portion formed over the element formation layer;
an antenna formed over the element formation layer; and
a resin layer formed over the element formation layer, the storage element portion and the antenna,
wherein the element formation layer comprises a plurality of circuits, the plurality of circuits comprising a battery, a read-write circuit for writing in data to the storage element portion and for reading out the data from the storage element portion, and a semiconductor layer including an n-type impurity region and a p-type impurity region which are jointed,
wherein the semiconductor layer is formed on the same surface as the read-write circuit,
wherein an electromagnetic wave supplies a power source voltage to each of the plurality of circuits, and
wherein a value in a thickness ratio of the resin layer formed on the antenna to the antenna is at least 0.2.

10. The semiconductor device according to claim 9, wherein the resin layer comprises epoxy resin.

11. The semiconductor device according to claim 9, wherein the substrate has a thickness of 2 μm to 20 μm.

12. The semiconductor device according to claim 9, wherein an adhesive layer is provided between the substrate and the element formation layer.

13. A semiconductor device, comprising:
an element formation layer formed over a substrate;
a storage element portion formed over the element formation layer;
an antenna formed over the element formation layer; and
a protective film formed over the element formation layer, the storage element portion and the antenna,
wherein the element formation layer comprises a plurality of circuits, the plurality of circuits comprising a battery, a read-write circuit for writing in data into the storage element portion and for reading out the data from the storage element portion, and a semiconductor layer including an n-type impurity region and a p-type impurity region which are jointed, wherein the semiconductor layer is formed on the same surface as the read-write circuit, wherein an electromagnetic wave supplies a power source voltage to each of the plurality of circuits, and wherein a value in a thickness ratio of the protective film formed on the antenna to the antenna is at least 0.2.

14. The semiconductor device according to claim 13, wherein the protective film comprises epoxy resin.

15. The semiconductor device according to claim 13, wherein the substrate has a thickness of 2 μm to 20 μm.

16. The semiconductor device according to claim 13, wherein an adhesive layer is provided between the substrate and the element formation layer.

* * * * *